(12) United States Patent
Gomi et al.

(10) Patent No.: US 6,977,426 B1
(45) Date of Patent: Dec. 20, 2005

(54) SEMICONDUCTOR DEVICE INCLUDING HIGH SPEED TRANSISTORS AND HIGH VOLTAGE TRANSISTORS DISPOSED ON A SINGLE SUBSTRATE

(75) Inventors: Takayuki Gomi, Tokyo (JP); Hiroaki Ammo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/965,286

(22) Filed: Nov. 6, 1997

Related U.S. Application Data

(62) Division of application No. 08/762,779, filed on Dec. 10, 1996, now Pat. No. 5,976,940.

(30) Foreign Application Priority Data

Dec. 12, 1995 (JP) ............................... P07-322962

(51) Int. Cl.[7] .................. H01L 29/00; H01L 27/082
(52) U.S. Cl. ............... 257/553; 257/566; 257/575; 438/340; 438/357; 438/358
(58) Field of Search ................. 257/370, 378, 257/565, 566, 574–576, 553, 555; 438/340

(56) References Cited

U.S. PATENT DOCUMENTS

| | | | |
|---|---|---|---|
| 3,702,428 A | 11/1972 | Schmitz et al. | 257/565 |
| 4,038,680 A | 7/1977 | Yagi et al. | 257/565 |
| 4,170,501 A | 10/1979 | Khajezadeh | 257/565 |
| 4,258,379 A * | 3/1981 | Watanabe et al. | 257/574 |
| 4,357,622 A | 11/1982 | Magdo et al. | 257/565 |
| 4,379,726 A * | 4/1983 | Kumamaru et al. | 257/552 |
| 4,826,780 A * | 5/1989 | Takemoto et al. | 257/370 |
| 4,898,836 A | 2/1990 | Zambrano et al. | 438/309 |
| 4,910,160 A | 3/1990 | Jennings et al. | 438/309 |
| 4,940,671 A | 7/1990 | Small et al. | 438/309 |
| 4,969,823 A | 11/1990 | Lapham et al. | 438/309 |
| 5,151,765 A * | 9/1992 | Yamauchi | 257/553 |
| 5,344,785 A | 9/1994 | Jerome et al. | 438/309 |
| 5,529,939 A | 6/1996 | Lapham et al. | 438/309 |
| 5,648,676 A | 7/1997 | Iwai et al. | 257/500 |

FOREIGN PATENT DOCUMENTS

JP                358014564       *  7/1981  ................. 257/553

* cited by examiner

*Primary Examiner*—Ori Nadav
(74) *Attorney, Agent, or Firm*—Sonnenschein, Nath & Rosenthal LLP

(57) ABSTRACT

In a semiconductor device comprising a first bipolar transistor and a second bipolar transistor having different voltages formed on a semiconductor substrate made by forming an epitaxial layer on a silicon substrate, in an upper part of the silicon substrate the first bipolar transistor has an $N^+$-type first embedded diffusion layer having an impurity concentration higher than that of the epitaxial layer and the second bipolar transistor has an N-type second embedded diffusion layer having a lower impurity concentration and a deeper diffusion layer depth than the first embedded diffusion layer, whereby a high speed bipolar transistor and a high voltage bipolar transistor are formed on the same substrate.

14 Claims, 24 Drawing Sheets

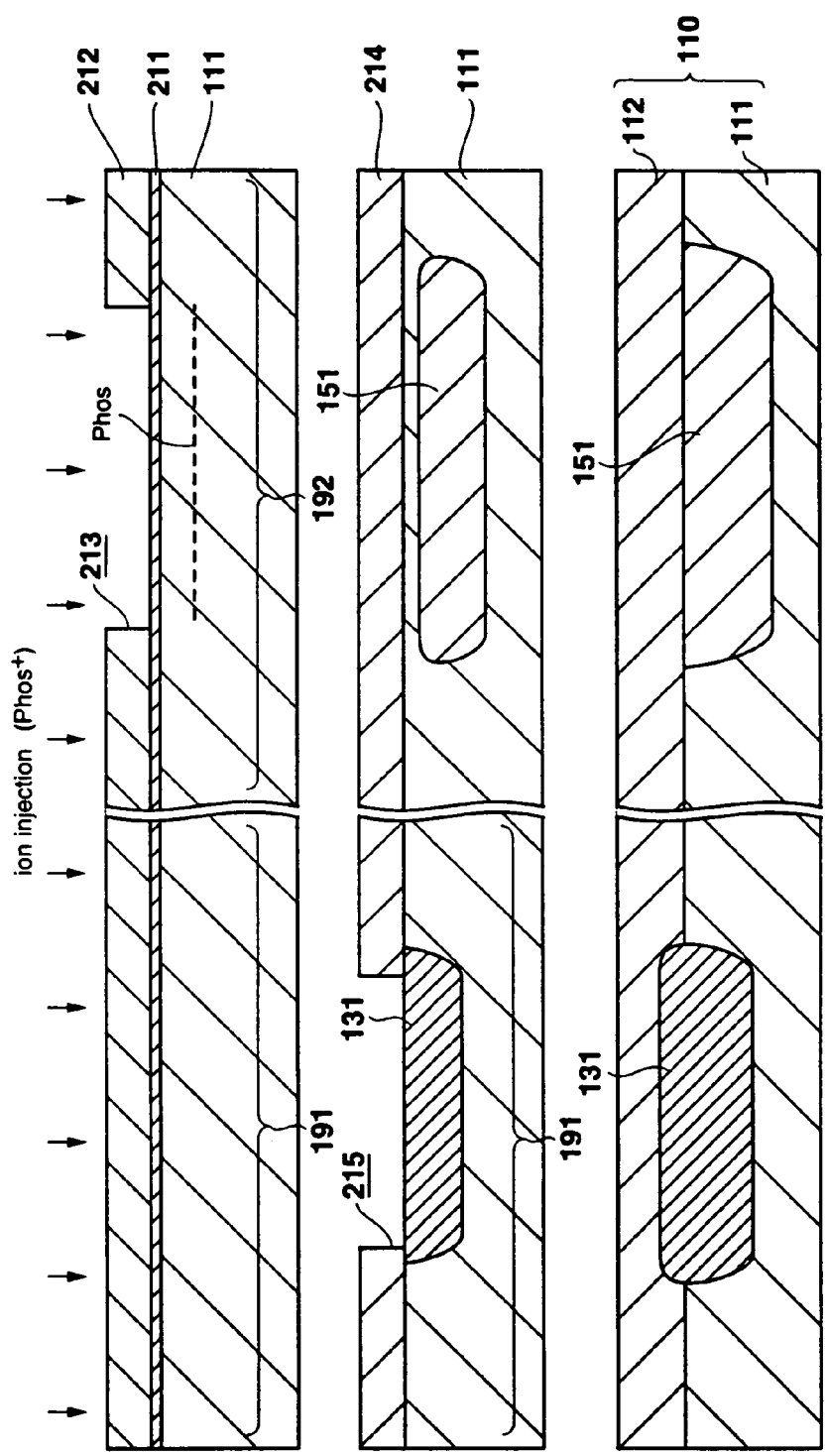

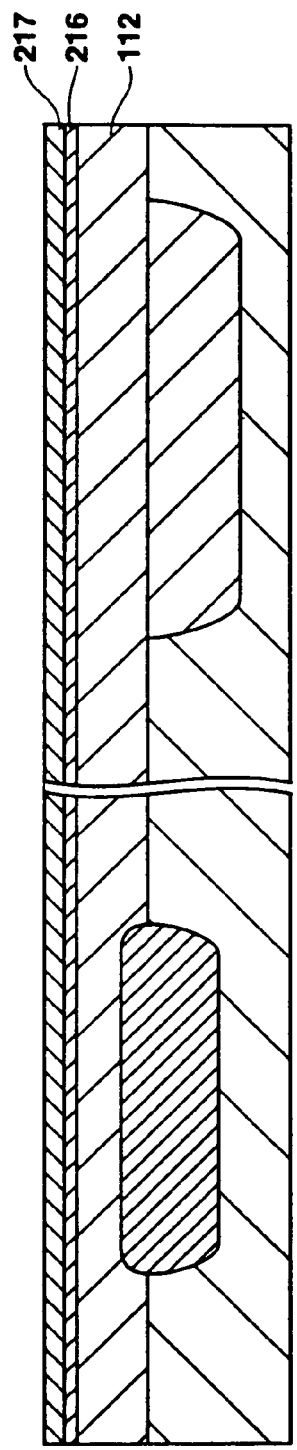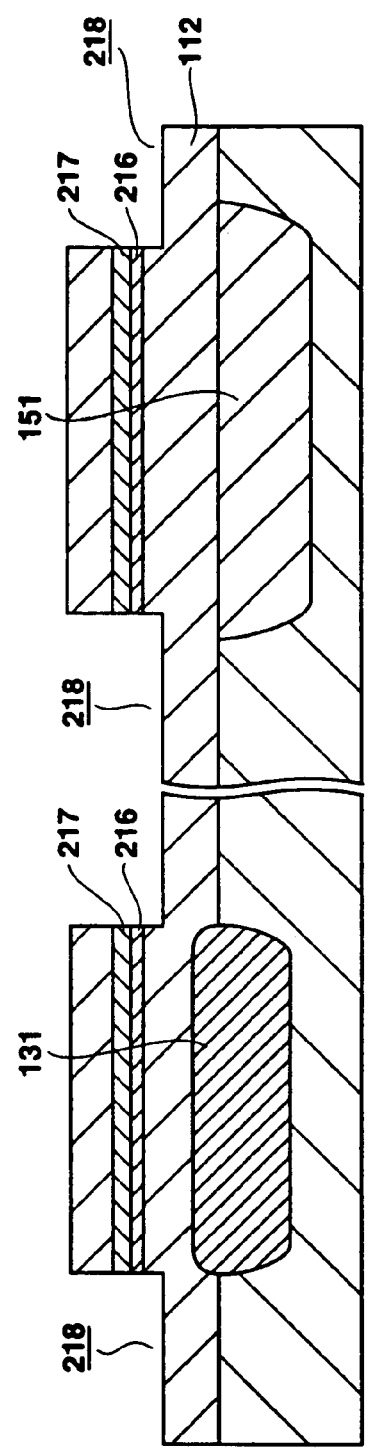
FIG. 8D
FIG. 8E

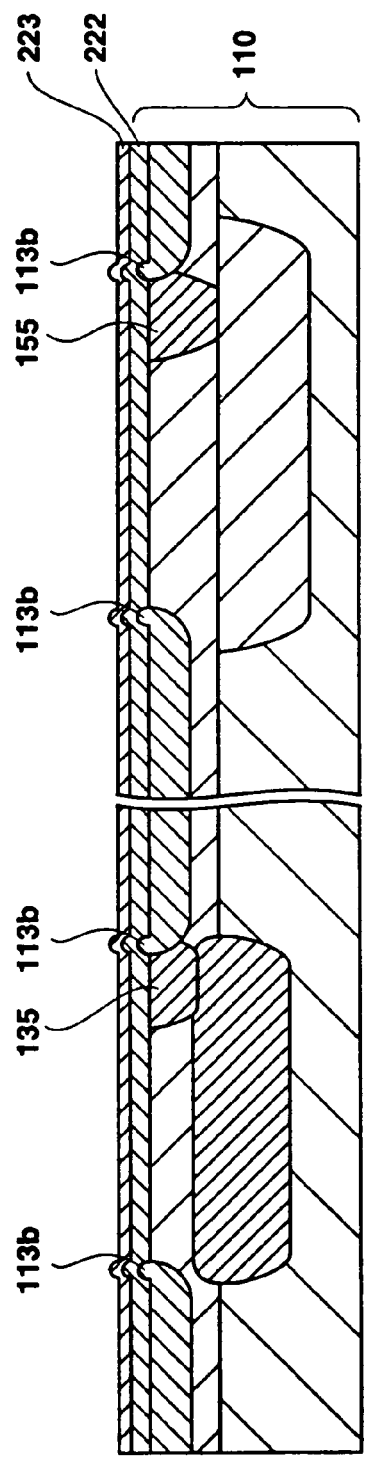
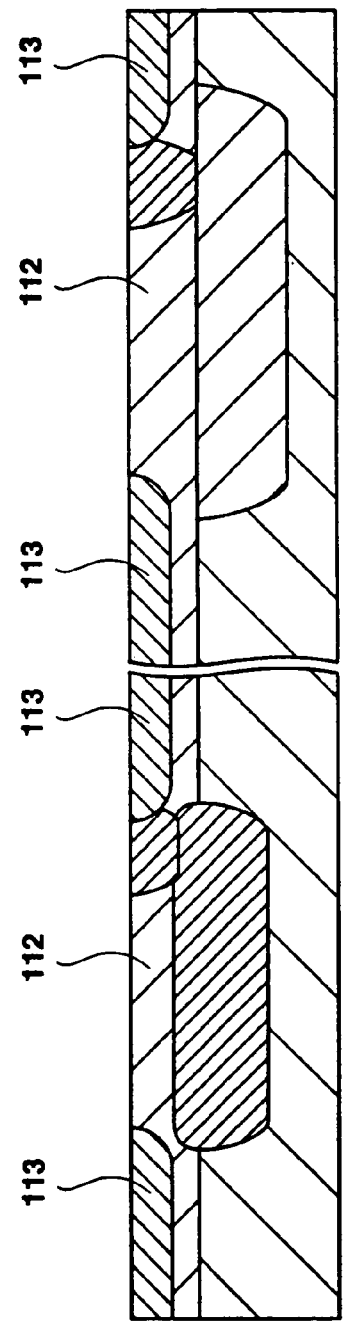
FIG. 8H
FIG. 8I

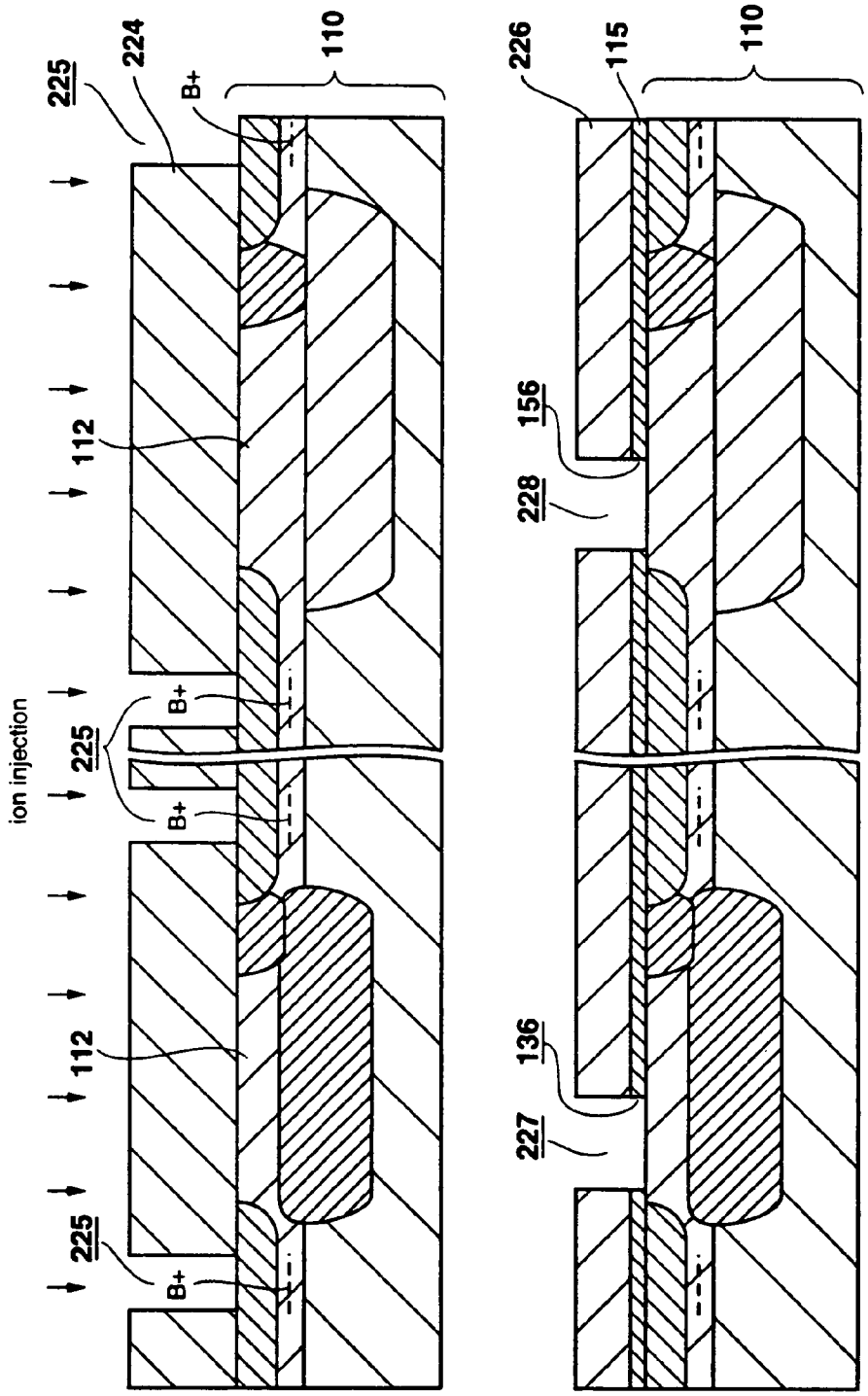

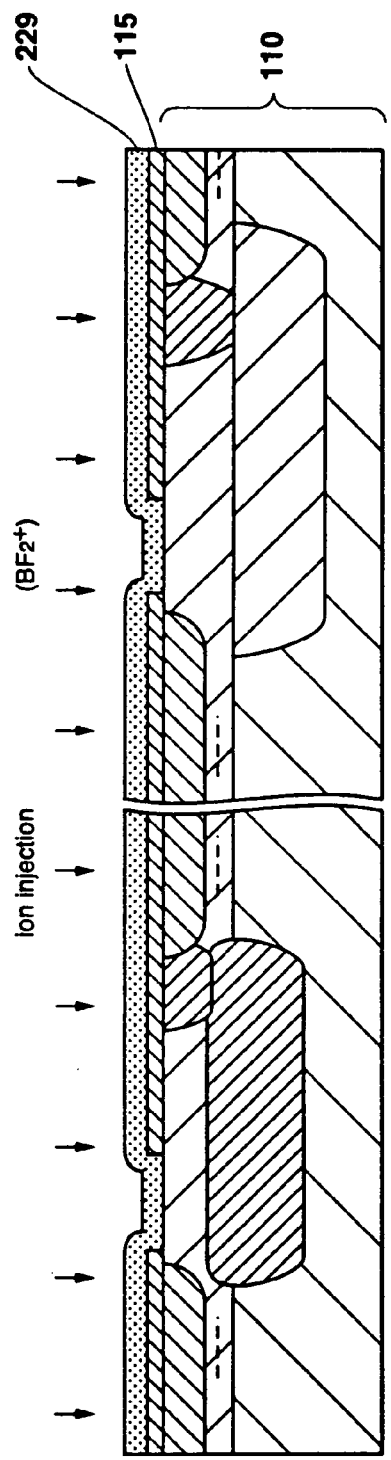
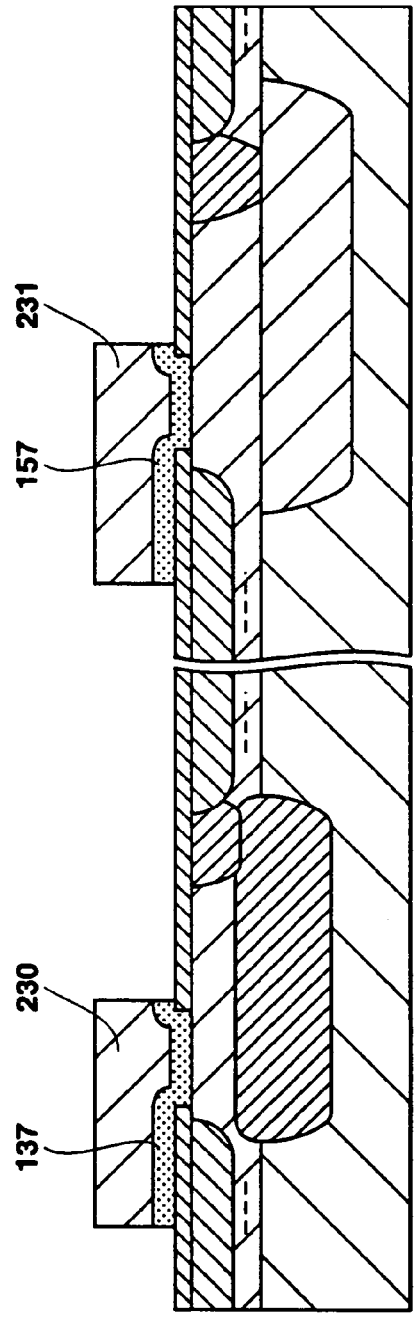
FIG. 8L
FIG. 8M

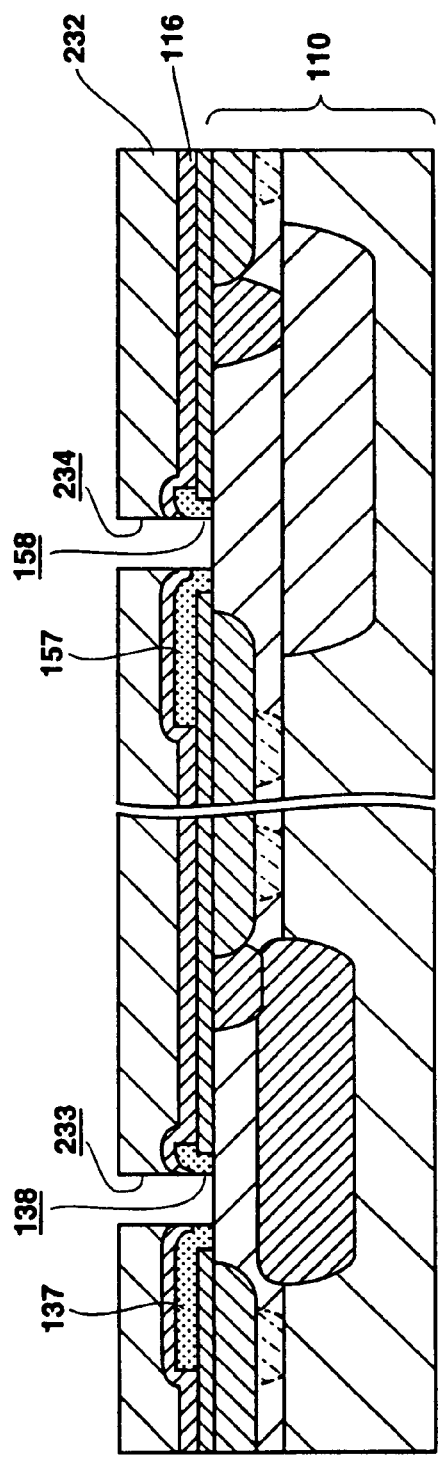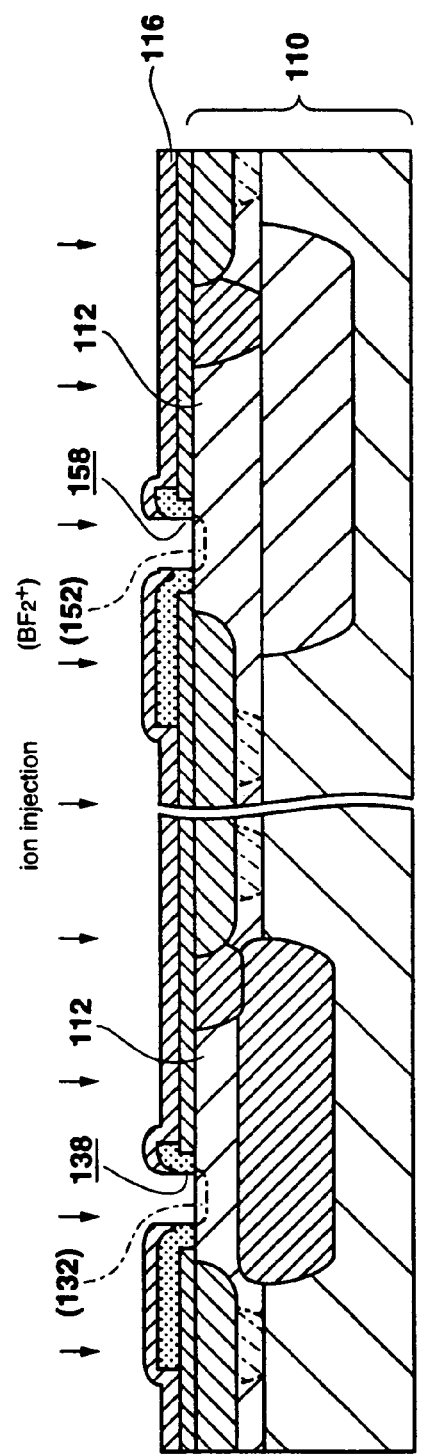

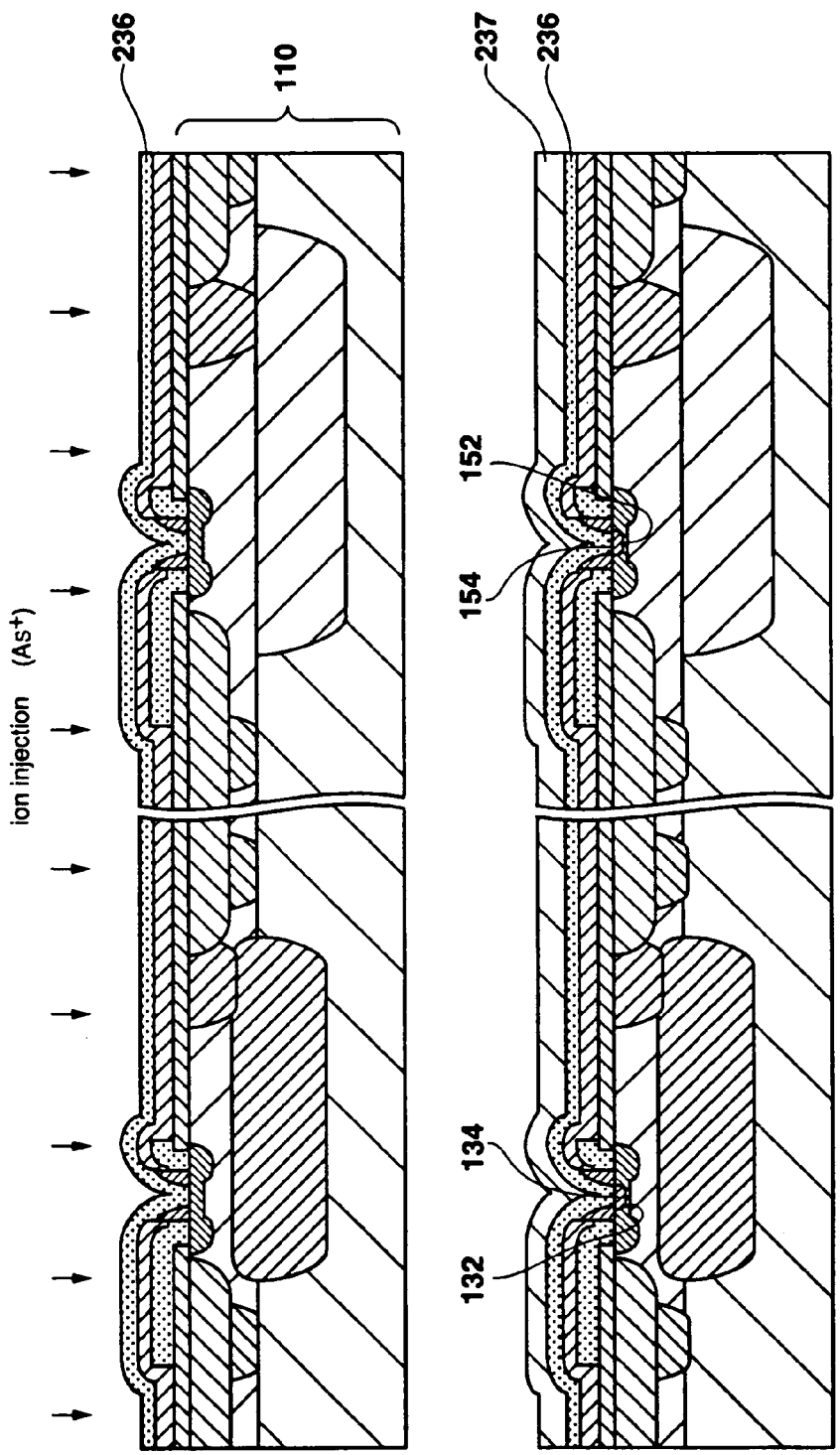

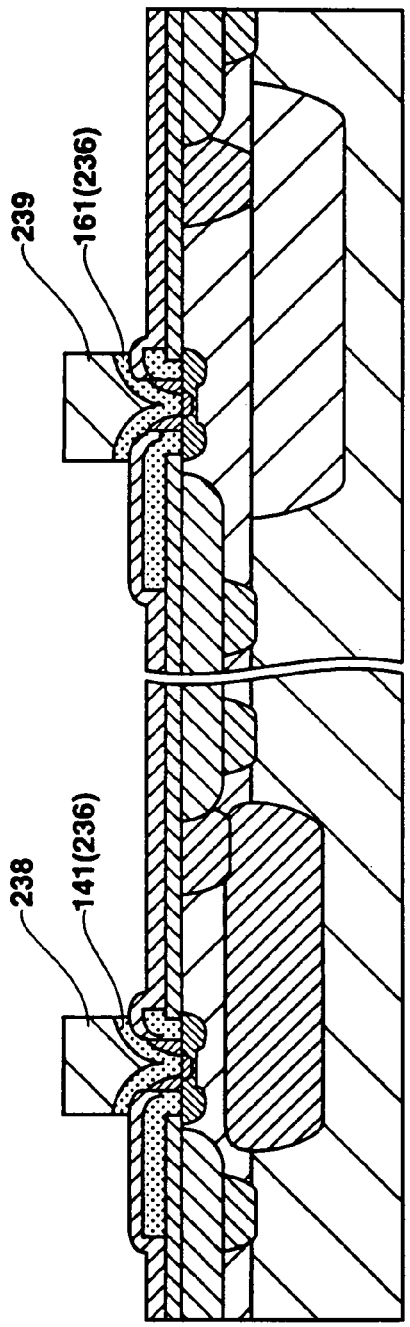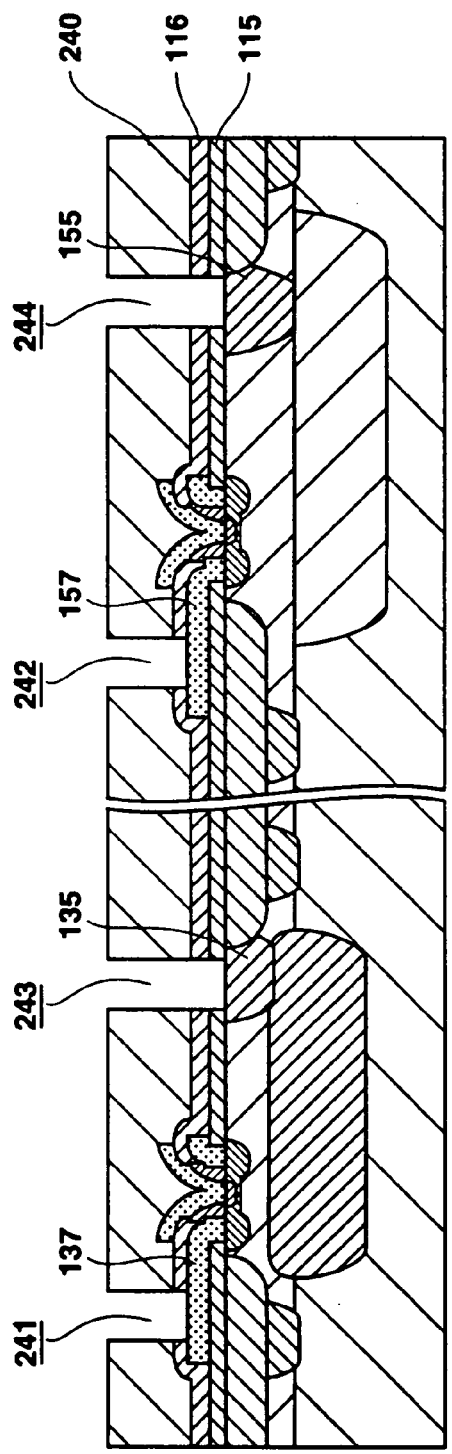
FIG. 8T
FIG. 8U

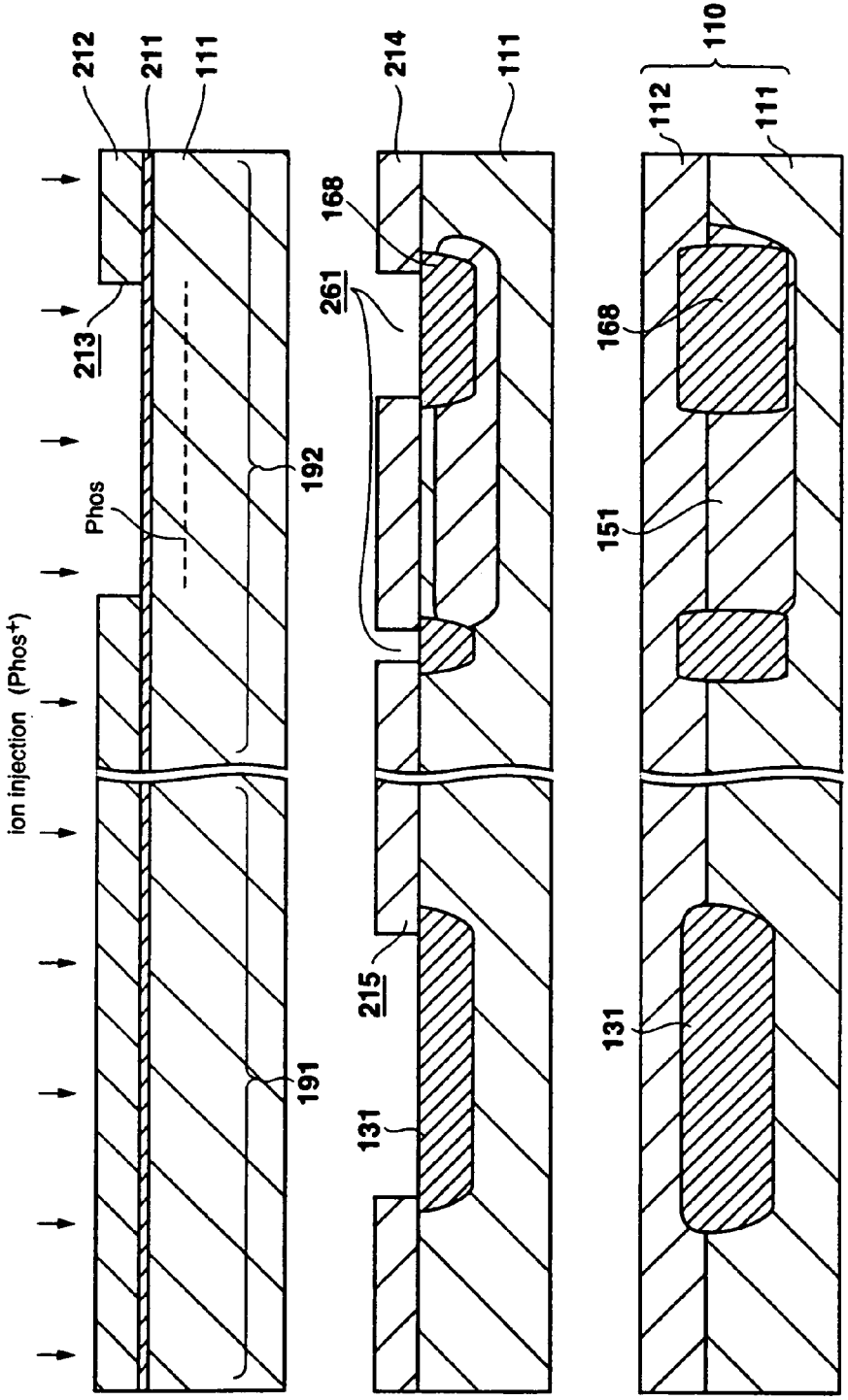

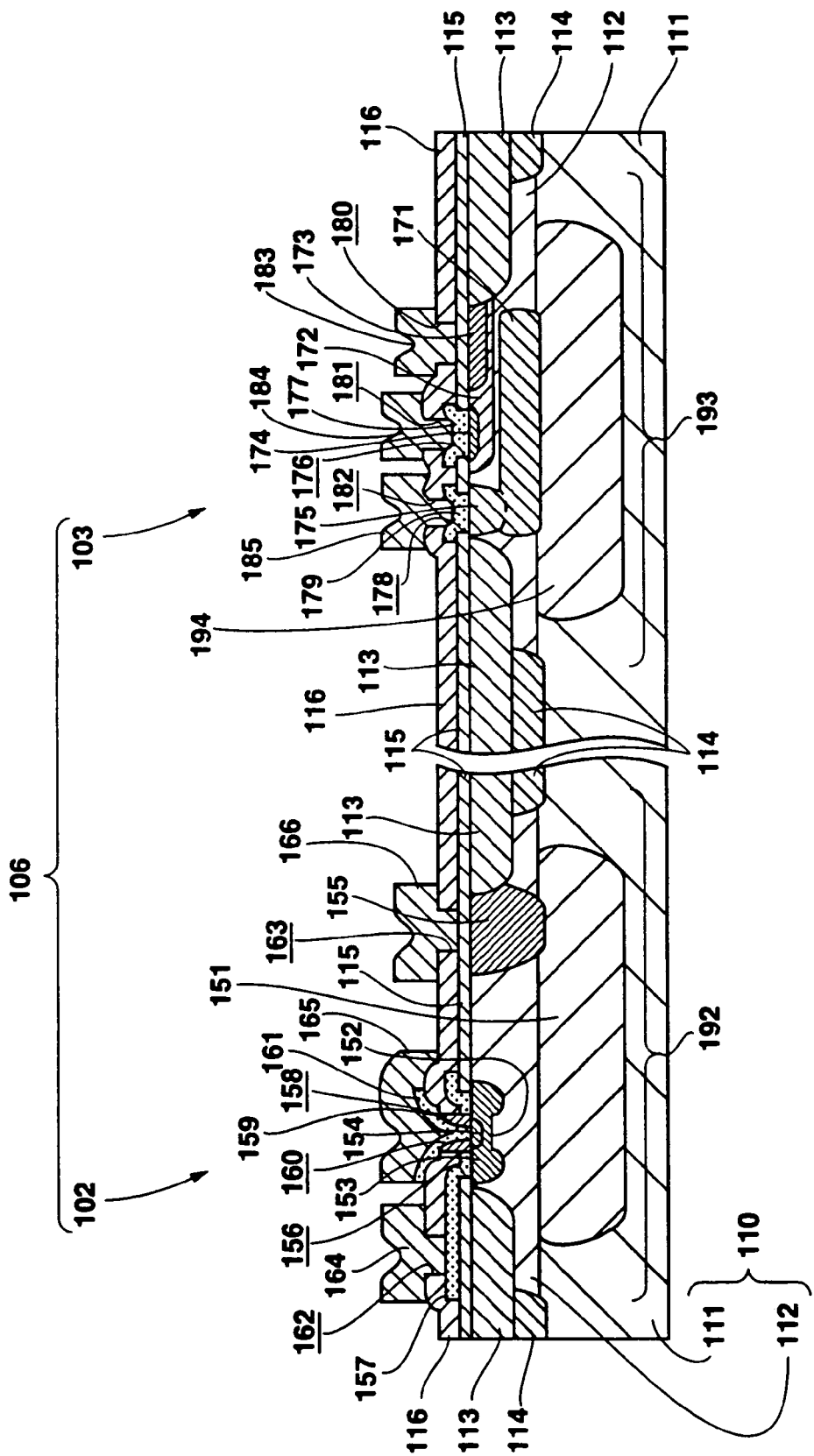

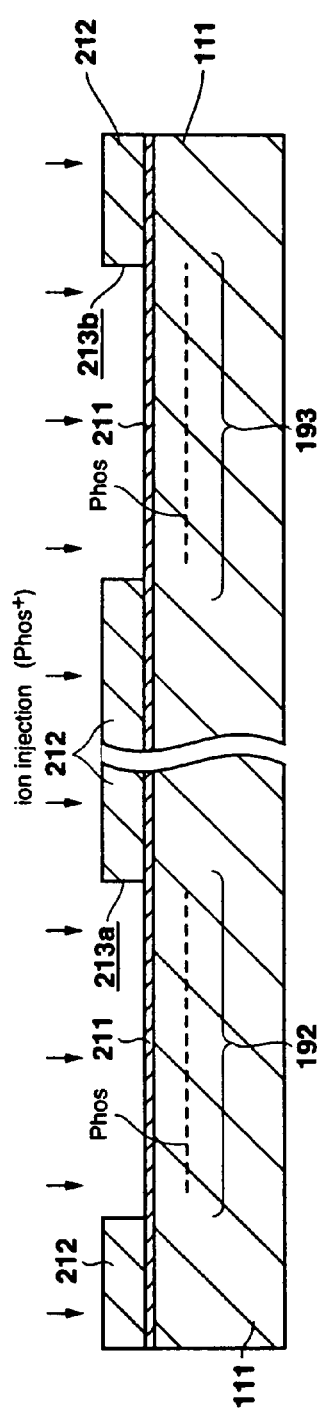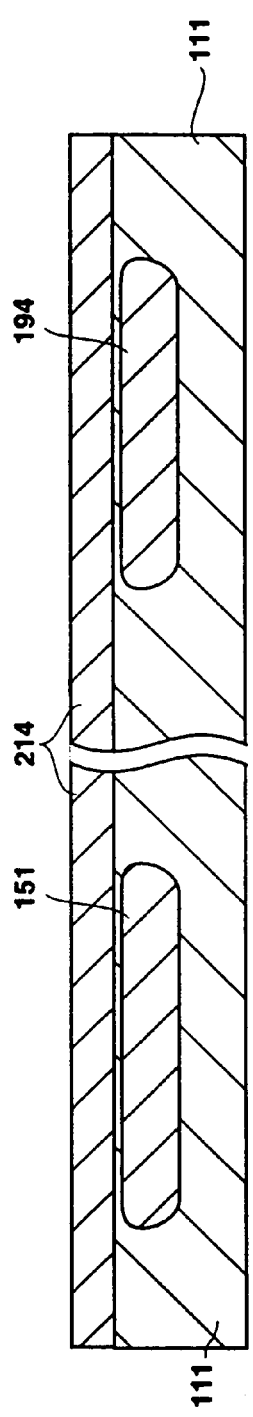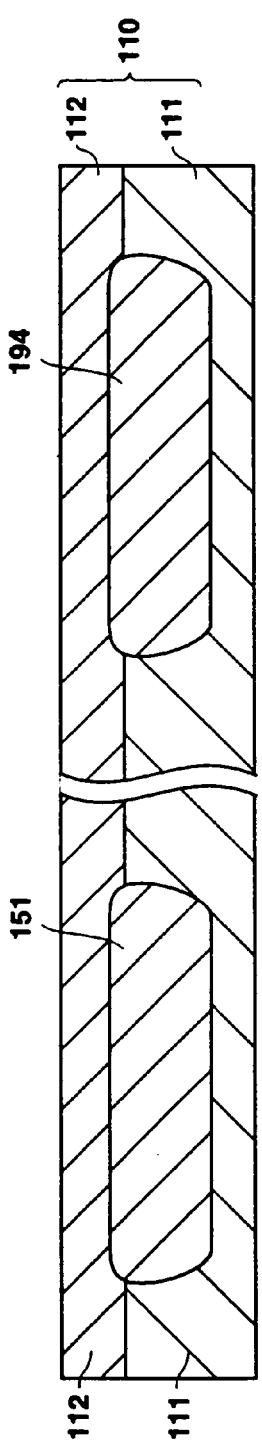
FIG. 12A
FIG. 12B
FIG. 12C

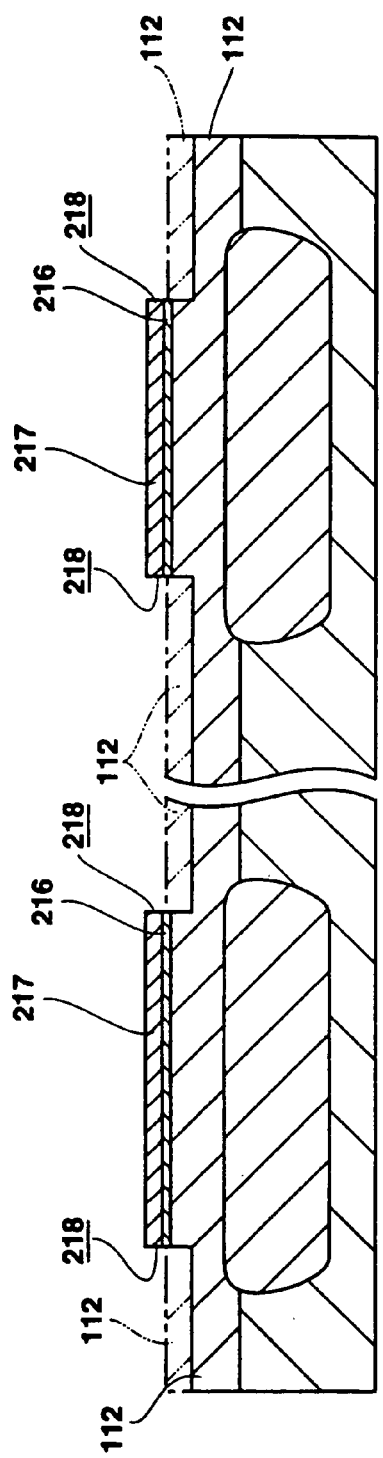
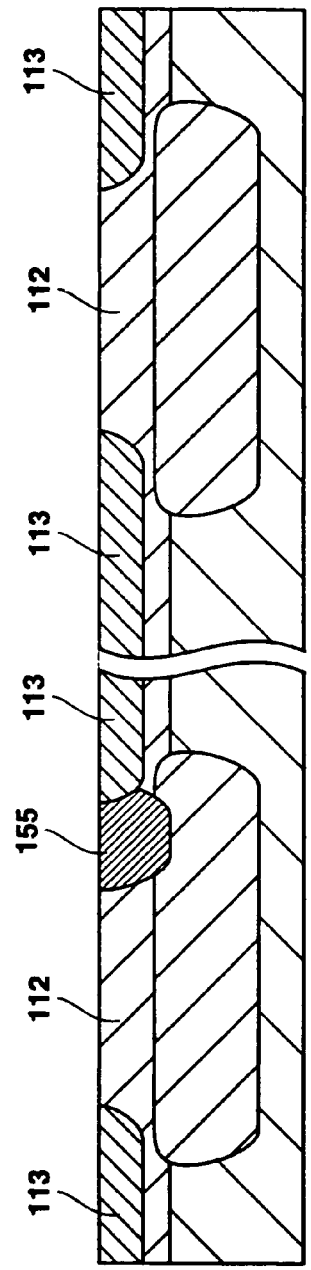
FIG. 12D
FIG. 12E

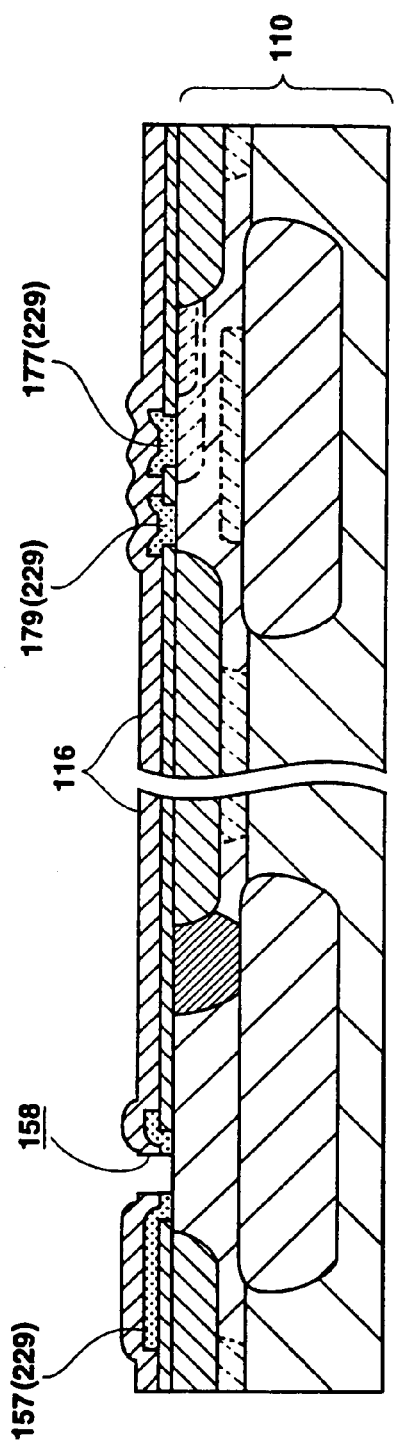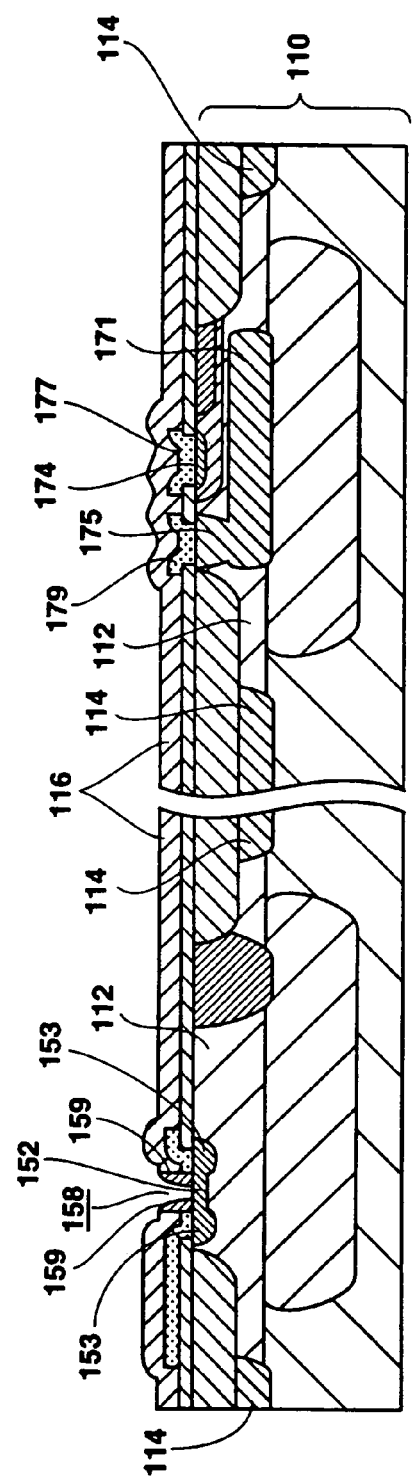
FIG. 12H
FIG. 12I

SEMICONDUCTOR DEVICE INCLUDING HIGH SPEED TRANSISTORS AND HIGH VOLTAGE TRANSISTORS DISPOSED ON A SINGLE SUBSTRATE

RELATED APPLICATION DATA

This patent is a divisional application of Ser. No. 08/762,779, filed on Dec. 10, 1996, and issued as U.S. Pat. No. 5,976,940. Moreover, this patent claims priority to Japanese Application No. P07-322962, filed Dec. 12, 1995, which application is incorporated by reference to the extent permitted by law.

BACKGROUND OF THE INVENTION

1. Field of the Invention

This invention relates to a semiconductor device wherein a high speed vertical type bipolar transistor and high voltage vertical type bipolar transistor are formed on the same substrate and a method of making the same.

2. Description of the Related Art

A vertical type NPN bipolar transistor of the related art constructed as a high speed bipolar transistor and a vertical type NPN bipolar transistor of the related art constructed as a high voltage bipolar transistor will be described with reference to FIG. 1 and FIG. 2.

FIG. 1 is a schematic sectional view of the construction of a high speed bipolar transistor.

As shown in FIG. 1, an N-type epitaxial layer 12 is formed on a P-type silicon substrate 11. An $N^+$-type embedded diffusion layer 31 is formed in an upper part of the P-type silicon substrate 11, and this $N^+$-type embedded diffusion layer 31 is also diffused into a lower part of the epitaxial layer 12. Also, on the epitaxial layer 12 is formed a device separating oxide film 13 for isolating a region where a high speed bipolar transistor 1 is formed. Below this device separating oxide film 13 a $P^+$-type device separating diffusion layer 14 reaching the silicon substrate 11 is formed.

A P-type base layer 32 and a $P^+$-type graft base layer 33 connecting with this base layer 32 are formed in an upper part of the epitaxial layer 12 in the region where the high speed bipolar transistor 1 is formed. An $N^+$-type emitter layer 34 is formed in an upper part of this base layer 32. Also, an $N^+$-type collector leading layer 35 connecting with the embedded diffusion layer 31 is formed in a position away from the graft base layer 33 in the epitaxial layer 12 in the region where the high speed bipolar transistor 1 is formed.

A first oxide film 15 is formed on the epitaxial layer 12, and a first opening 16 is formed in the first oxide film 15 above the graft base layer 33. A base leading electrode 36 connecting with the graft base layer 33 through the first opening 16 is formed on the first oxide film 15. Also, a second oxide film 17 is formed on the first oxide film 15 in such a state that it covers the base leading electrode 36.

A second opening 18 is formed in the second oxide film 17 above the base layer 32, and on the side wall thereof a side wall insulating film 19 is formed. The inner side of this side wall insulating film 19 forms an emitter opening, and the above-mentioned emitter layer 34 is at the bottom of this emitter opening.

An emitter leading electrode 37 connecting with the emitter layer 34 through the emitter opening is formed on the second oxide film 17.

Also formed are a base electrode 38 connecting with the base leading electrode 36 through the second oxide film 17, an emitter electrode 39 connecting with the emitter leading electrode 37, and a collector electrode 40 connecting with the collector leading layer 35 through the second oxide film 17 and the first oxide film 15.

Thus is constructed the high speed bipolar transistor 1.

FIG. 2 is a schematic sectional view of the construction of a high voltage bipolar transistor.

As shown in FIG. 2, an N-type epitaxial layer 50 thicker than the epitaxial layer (12) of the high speed bipolar transistor (1) described above is formed on a P-type silicon substrate 11. An $N^+$-type embedded diffusion layer 51 deeper than the embedded diffusion layer (31) of the high speed bipolar transistor (1) described above is formed in an upper part of the silicon substrate 11, and this embedded diffusion layer 51 is also diffused into a lower part of the epitaxial layer 50. Also, on the epitaxial layer 50 is formed a device separating oxide film 13 for isolating a region where a high voltage bipolar transistor 2 is formed. Below this device separating oxide film 13 a $P^+$-type device separating diffusion layer 14 reaching the silicon substrate 11 is formed.

A P-type base layer 52 and a $P^+$-type graft base layer 53 connecting with this base layer 52 are formed in an upper part of the epitaxial layer 50 in the region where the high voltage bipolar transistor 2 is formed. An $N^+$-type emitter layer 54 is formed in an upper part of this base layer 52. Also, an $N^+$-type collector leading layer 55 connecting with the embedded diffusion layer 51 is formed in the epitaxial layer 50 in a position away from the graft base layer 53 in the region where the high voltage bipolar transistor 2 is formed.

A first oxide film 15 is formed on the epitaxial layer 50, and a first opening 16 is formed in the first oxide film 15 above the graft base layer 53. A base leading electrode 56 connecting with the graft base layer 53 through the first opening 16 is formed on the first oxide film 15. Also, a second oxide film 17 is formed on the first oxide film 15 in such a state that it covers the base leading electrode 56.

A second opening 18 is formed in the second oxide film 17 above the base layer 52, and on the side wall thereof a side wall insulating film 19 is formed. The inner side of this side wall insulating film 19 forms an emitter opening, and the above-mentioned emitter layer 54 is at the bottom of this emitter opening.

An emitter leading electrode 57 connecting with the emitter layer 54 through the emitter opening is formed on the second oxide film 17.

Also formed are a base electrode 58 connecting with the base leading electrode 56 through the second oxide film 17, an emitter electrode 59 connecting with the emitter leading electrode 57, and a collector electrode 60 connecting with the collector leading layer 55 through the second oxide film 17 and the first oxide film 15.

Thus is constructed the high voltage bipolar transistor 2.

The impurity distributions of the high speed bipolar transistor 1 and the high voltage bipolar transistor 2 described above will now be explained with reference to FIG. 3 and FIG. 4.

FIG. 3 shows the impurity distribution in the depth direction of the high speed bipolar transistor 1. In FIG. 3, the vertical axis shows impurity concentration on a log scale and the horizontal axis shows depth from the surface of the silicon substrate.

As shown in FIG. 3, the impurity distribution in the depth direction of the high speed bipolar transistor 1 has the characteristic that the N-type epitaxial layer 12 is thin and its impurity concentration is high.

FIG. 4 shows the impurity distribution of the high voltage bipolar transistor 2. In FIG. 4 also, the vertical axis shows impurity concentration on a log scale and the horizontal axis shows depth from the surface of the silicon substrate.

As shown in FIG. 4, in the impurity distribution of the high voltage bipolar transistor 2, the impurity concentrations of the $N^+$-type emitter layer 54 and the P-type silicon substrate 11 are the same as the impurity concentrations of their counterparts in the high speed bipolar transistor 1. On the other hand, there is the characteristic that the N-type epitaxial layer 50, compared to the N-type epitaxial layer 12 of the high speed bipolar transistor 1, is thick and its impurity concentration is low. Also, the P-type base layer 52 generally is thicker than the base layer of a high speed bipolar transistor.

Generally, to make the breakdown voltage of the kind of bipolar transistor described above high, it is necessary to make the concentration of the N-type epitaxial layer low and make the layer thick.

The lower the impurity density of the epitaxial layer is, and the thicker the epitaxial layer is, the greater the voltage (breakdown voltage) of the bipolar transistor is. Also, even if the density of the epitaxial layer is kept fixed and only the thickness of the epitaxial layer is increased, the voltage (breakdown voltage) of the bipolar transistor rises.

The relationship between the base impurity density and the base width is such that to increase the breakdown voltage of a bipolar transistor it is necessary to moderately increase the base concentration and to some extent make the base width thick.

For this reason also, it is necessary to make the N-type epitaxial layer thick.

When the concentration of the N-type epitaxial layer is made low and the layer is made thick, it is necessary to make the $N^+$-type embedded layer region for suppressing parasitic bipolar transistor operation wide and make the $P^+$ separating region deep in order to certainly effect device separation. That is, it is necessary to make the cell dimensions large.

However, in a high speed bipolar transistor, to suppress the collector Kirk effect, it is necessary to make the concentration of the N-type epitaxial layer high and make the layer thin. On the other hand, as explained above, in a high voltage bipolar transistor, to obtain voltage, it is necessary to make the concentration of the N-type epitaxial layer low and make the layer thick.

Thus, the epitaxial layer requirements of a high speed bipolar transistor and a high voltage bipolar transistor have been conflicting ones. Consequently, it has been difficult to form a high speed bipolar transistor and a high voltage bipolar transistor on the same substrate.

OBJECT AND SUMMARY OF THE INVENTION

Accordingly, an object of the present invention is to provide a semiconductor device wherein a high speed bipolar transistor and a high voltage bipolar transistor are formed on the same substrate and a method of manufacturing the same with a minimal number of additional steps.

To achieve the above-mentioned object and other objects, the invention provides a first semiconductor device wherein a first vertical type bipolar transistor and a second vertical type bipolar transistor having different voltages are formed on a semiconductor substrate made by forming an epitaxial layer on a silicon substrate; the first vertical type bipolar transistor has a first embedded diffusion layer formed in an upper part of the silicon substrate and of the same conductive type as the epitaxial layer and having an impurity concentration higher than that of the epitaxial layer, the second vertical type bipolar transistor has a second embedded diffusion layer formed in an upper part of the silicon substrate and of the same conductive type as the epitaxial layer, and the impurity concentration of the second embedded diffusion layer is lower than the impurity concentration of the first embedded diffusion layer and the depth of the second embedded diffusion layer is deeper than the depth of the first embedded diffusion layer.

In this first semiconductor device, since the first vertical type bipolar transistor has a first embedded diffusion layer formed in an upper part of the silicon substrate and of the same conductive type as the epitaxial layer and having an impurity concentration higher than that of the epitaxial layer, although the epitaxial layer and the first embedded diffusion layer function as a collector layer, because the first embedded diffusion layer prevents the collector current from flowing in the layer direction of the epitaxial layer and causes it to flow into the first embedded diffusion layer, the effective collector layer becomes the epitaxial layer. In the second vertical type bipolar transistor, on the other hand, because it has a second embedded diffusion layer formed in an upper part of the silicon substrate and of the same conductive type as the epitaxial layer and having an impurity concentration lower than the impurity concentration of the first embedded diffusion layer and formed in such a state that its depth is deeper than the depth of the first embedded diffusion layer, the epitaxial layer and the second embedded diffusion layer function as a collector layer.

Therefore, because the thickness of the collector layer of the first vertical type bipolar transistor is thinner than the thickness of the collector layer of the second vertical type bipolar transistor and the impurity concentration of the first embedded diffusion layer is higher than that of the second embedded diffusion layer, the first vertical type bipolar transistor operates at a higher speed than the second vertical type bipolar transistor and the voltage of the second vertical type bipolar transistor is higher than that of the first vertical type bipolar transistor.

Furthermore, since the operating speeds and the voltages are changed by changing the impurity concentrations and the depths of the first and second embedded diffusion layers, it is possible to form the first and second vertical type bipolar transistors on the same substrate.

The invention also provides a second semiconductor device wherein a first vertical type bipolar transistor, a second vertical type bipolar transistor whose voltage is different from that of the first vertical type bipolar transistor and a third vertical type bipolar transistor having the opposite polarity to the polarity of the second vertical type bipolar transistor are formed on a semiconductor substrate made by forming an epitaxial layer on a silicon substrate. The first vertical type bipolar transistor has a first embedded diffusion layer formed in an upper part of the silicon substrate and of the same conductive type as the epitaxial layer. The second vertical type bipolar transistor has a second embedded diffusion layer formed in an upper part of the silicon substrate and of the same conductive type as the epitaxial layer and having an impurity concentration lower than the impurity concentration of the first embedded diffusion layer and having a depth deeper than the depth of the first embedded diffusion layer. Also, the third vertical type bipolar transistor has a separating diffusion layer formed in an upper part of the silicon substrate for separating a third embedded diffusion layer of the opposite conductive type to the epitaxial layer from the silicon substrate.

In this second semiconductor device, because the separating diffusion layer of the third vertical type bipolar transistor is a diffusion layer for separating a third embedded diffusion layer of the opposite conductive type to the epitaxial layer from the silicon substrate, it is of the same conductive type as the epitaxial layer. Also, because the second embedded diffusion layer of the second vertical type bipolar transistor is of the same conductive type as the epitaxial layer and has an impurity concentration lower than the impurity concentration of the first embedded diffusion layer and has a depth deeper than the depth of the first embedded diffusion layer, it is possible to constitute the separating diffusion layer and the second embedded diffusion layer with diffusion layers formed in the same step.

Also, as in the first semiconductor device described above, the first vertical type bipolar transistor operates at a higher speed than the second vertical type bipolar transistor and the second vertical type bipolar transistor has a higher voltage than the first vertical type bipolar transistor, and furthermore since the operating speeds and the voltages are changed by changing the impurity concentrations and the depths of the first and second embedded diffusion layers it is possible to form the first and second vertical type bipolar transistors on the same substrate.

The invention also provides a first semiconductor device manufacturing method for manufacturing a semiconductor device wherein a first vertical type bipolar transistor and a second vertical type bipolar transistor whose voltage is different from that of the first vertical type bipolar transistor are formed on a semiconductor substrate made by forming an epitaxial layer on a silicon substrate, in which manufacturing method the following steps are carried out before the epitaxial layer is formed on the silicon substrate: a step of forming in an upper part of the silicon substrate in a region where the first vertical type bipolar transistor is to be formed a first embedded diffusion layer of the same conductive type as the epitaxial layer and having an impurity concentration higher than the impurity concentration of the epitaxial layer; and a step of forming in an upper part of the silicon substrate in a region where the second vertical type bipolar transistor is to be formed a second embedded diffusion layer of the same conductive type as the epitaxial layer and having an impurity concentration lower than the impurity concentration of the first embedded diffusion layer and at a depth deeper than the depth of the first embedded diffusion layer.

In this first semiconductor device manufacturing method, because a first embedded diffusion layer of the same conductive type as the epitaxial layer is formed in an upper part of the silicon substrate in the region where the first vertical type bipolar transistor is to be formed, in the first vertical type bipolar transistor, although the epitaxial layer and the first embedded diffusion layer constitute a collector layer, effectively only the epitaxial layer serves as a collector layer. On the other hand, because a second embedded diffusion layer of the same conductive type as the epitaxial layer is formed in an upper part of the silicon substrate in the region where the second vertical type bipolar transistor is to be formed, in the second vertical type bipolar transistor the epitaxial layer and the second embedded diffusion layer serve as an effective collector layer. Furthermore, because the impurity concentration of the second embedded diffusion layer is lower than the impurity concentration of the first embedded diffusion layer and the depth of the second embedded diffusion layer is deeper than the depth of the first embedded diffusion layer, the effective collector layer of the second bipolar transistor is thicker than the effective collector layer of the first bipolar transistor and also its impurity concentration is lower. Consequently, the first vertical type bipolar transistor can operate at a higher speed than the second vertical type bipolar transistor and the second vertical type bipolar transistor has a higher voltage than the first vertical type bipolar transistor.

The invention also provides a second semiconductor device manufacturing method wherein a first vertical type bipolar transistor, a second vertical type bipolar transistor whose voltage is different from that of the first vertical type bipolar transistor and a third vertical type bipolar transistor of the opposite polarity to the polarity of the second vertical type bipolar transistor are formed on a semiconductor substrate made by forming an epitaxial layer on a silicon substrate, in which manufacturing method the following steps are carried out before the epitaxial layer is formed on the silicon substrate: a step of forming in an upper part of the silicon substrate in a region where the second vertical type bipolar transistor is to be formed a second embedded diffusion layer of the same conductive type as the epitaxial layer and having an impurity concentration lower than the impurity concentration of a first embedded diffusion layer formed in a region where the first vertical type bipolar transistor is to be formed and having a depth deeper than the depth of the first embedded diffusion layer; and a step of forming in an upper part of the silicon substrate in a region where the third vertical type bipolar transistor is to be formed a separating diffusion layer for separating a third embedded diffusion layer of the opposite conductive type to the epitaxial layer from the silicon substrate simultaneously with the step of forming the second embedded diffusion layer.

In this second semiconductor device manufacturing method, because a step of forming in an upper part of the silicon substrate in the region where the second vertical type bipolar transistor is to be formed a second embedded diffusion layer of the same conductive type as the epitaxial layer and having an impurity concentration lower than the impurity concentration of a first embedded diffusion layer formed in the region where the first vertical type bipolar transistor is to be formed and having a depth deeper than the depth of the first embedded diffusion layer is carried out, the second vertical type bipolar transistor formed in this region has a higher voltage than the first vertical type bipolar transistor. Furthermore, because the step of forming the second embedded diffusion layer in the region where the second vertical type bipolar transistor is to be formed is carried out simultaneously with the step of forming the separating diffusion layer in the region where the third vertical type bipolar transistor is to be formed, it is not necessary to carry out a new step to form the second embedded diffusion layer.

BRIEF DESCRIPTION OF THE DRAWINGS

FIG. 10A through FIG. 10C are views illustrating a manufacturing process of a fourth preferred embodiment of the invention;

FIG. 11 is a schematic sectional construction view of a semiconductor device of a fifth preferred embodiment of the invention;

FIG. 12A through FIG. 12J are views illustrating a manufacturing process of a sixth preferred embodiment of the invention.

DETAILED DESCRIPTION OF THE PREFERRED EMBODIMENTS

Preferred embodiments of the invention will now be described in detail with reference to the accompanying drawings.

Figure 1:
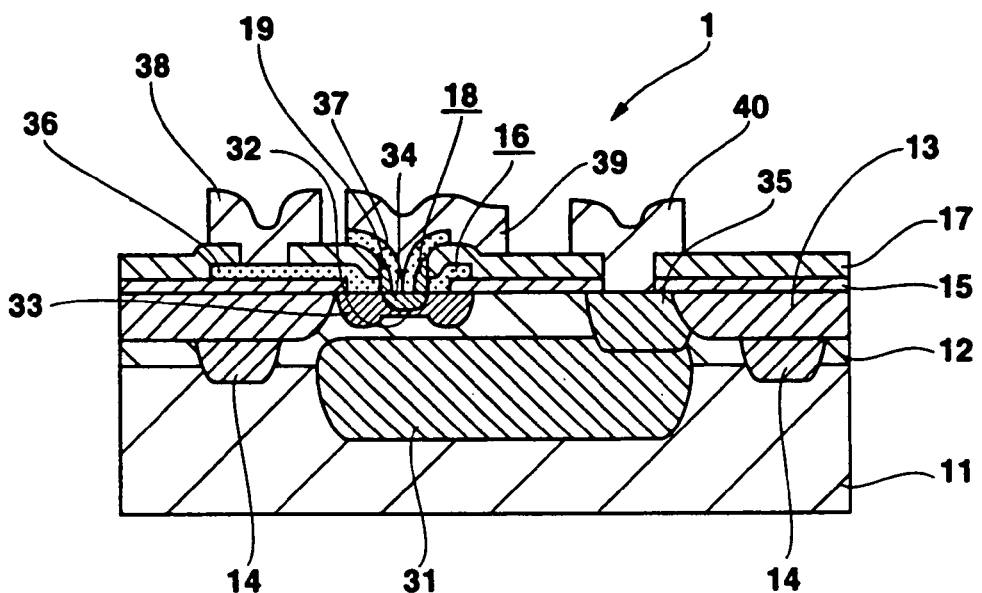
FIG. 1 is a schematic sectional construction view of a high speed bipolar transistor of the related art.
Figure 2:
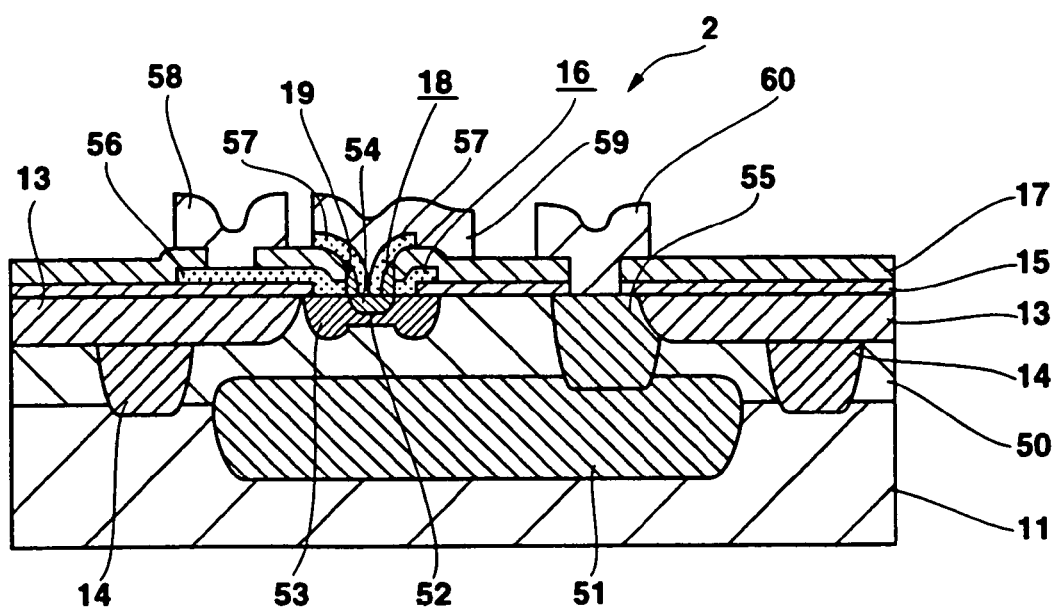
FIG. 2 is a schematic sectional construction view of a high voltage bipolar transistor of the related art.
Figure 3:
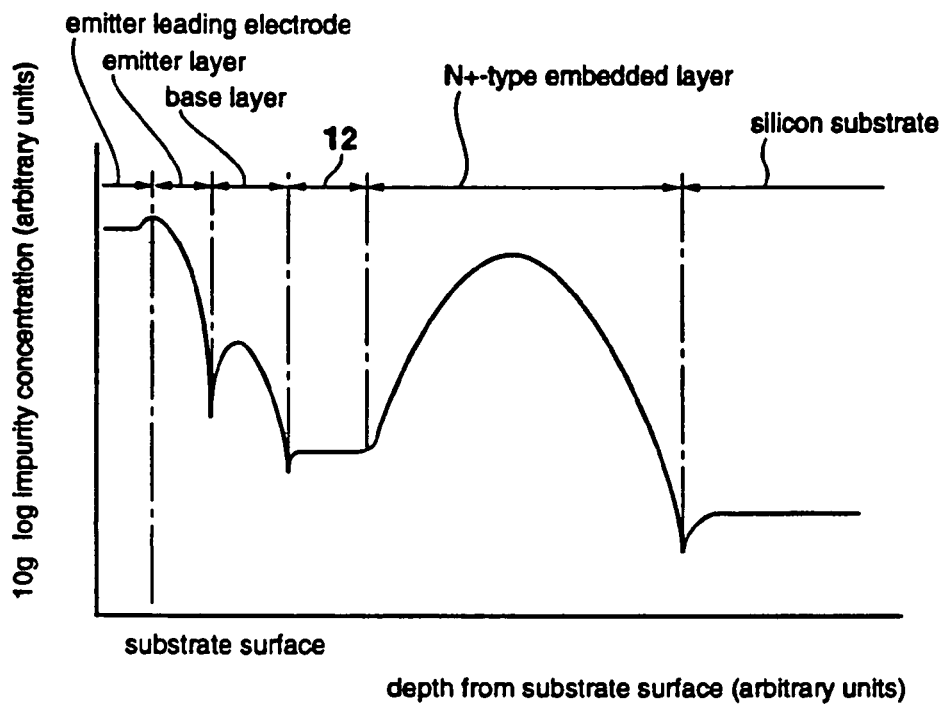
FIG. 3 is a graph showing an impurity distribution of a high speed bipolar transistor of the related art.
Figure 4:
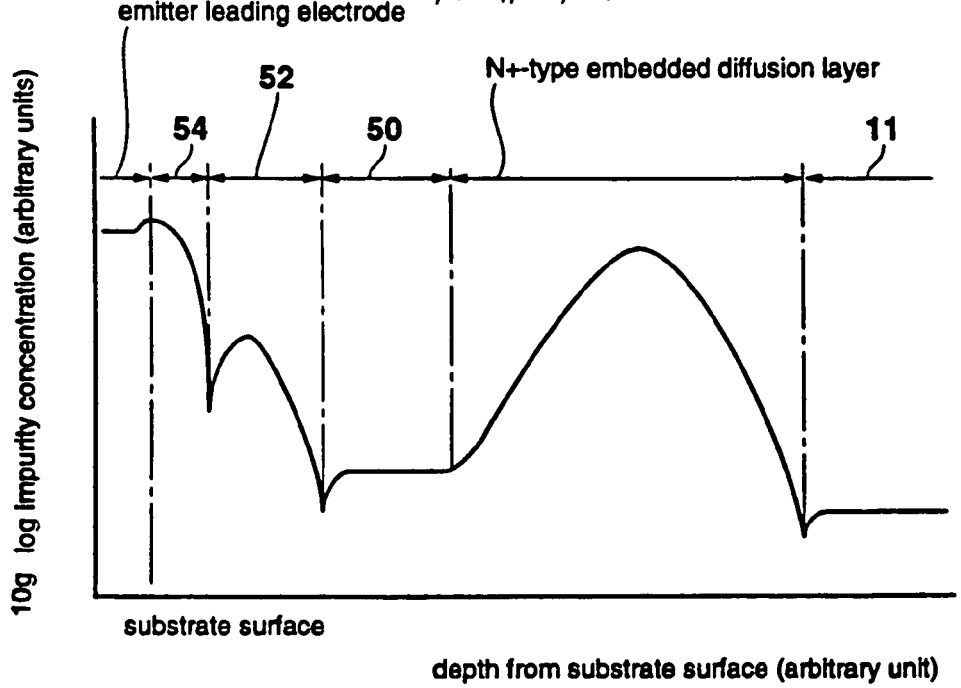
FIG. 4 is a graph showing an impurity distribution of a high voltage bipolar transistor of the related art.
Figure 5:
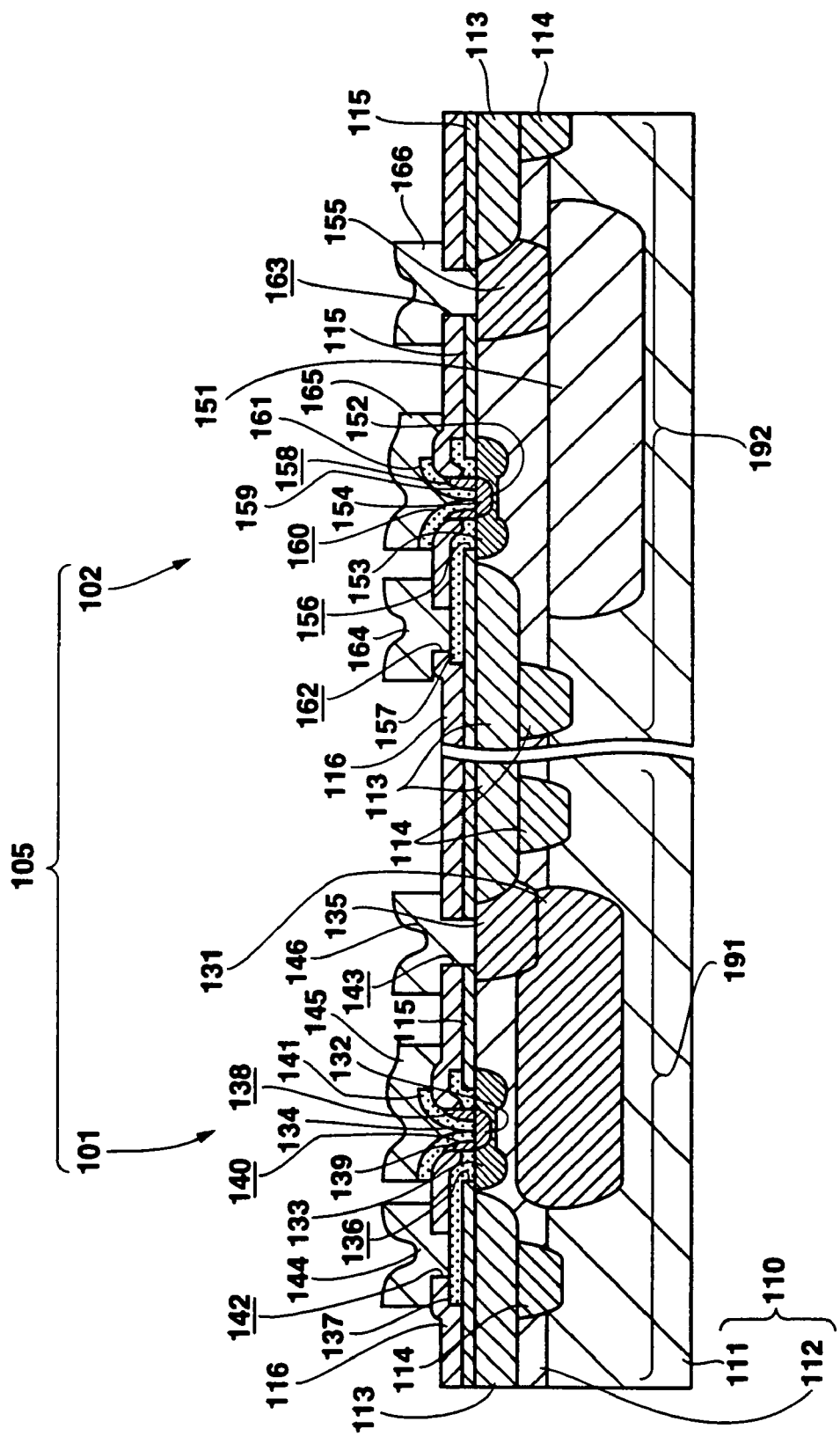
FIG. 5 is a schematic sectional construction view of a semiconductor device of a first preferred embodiment of the invention.

A semiconductor device of a first preferred embodiment of the invention will be described with reference to the schematic sectional construction view of FIG. 5. In FIG. 5, as an example, a high speed NPN bipolar transistor (hereinafter referred to as the first bipolar transistor) and a high voltage NPN bipolar transistor (hereinafter referred to as the second bipolar transistor) forming a so-called double silicon structure and having self-aligningly formed emitters and bases are shown.

As shown in FIG. 5, an N-type epitaxial layer 112 is formed on a P-type silicon substrate 111.

A device separating oxide film 113 for separating a first bipolar transistor formation region 191 and a second bipolar transistor formation region 192 is formed in the N-type epitaxial layer 112. A P+-type device separating diffusion layer 114 reaching the silicon substrate 111 is formed below this device separating oxide film 113.

An N+-type first embedded diffusion layer 131 is formed in an upper part of the silicon substrate 111 in the first bipolar transistor formation region 191, and this N+-type first embedded diffusion layer 131 is also diffused into a lower part of the epitaxial layer 112.

A P-type base layer 132 and a P+-type graft base layer 133 connecting with this P-type base layer 132 are formed in an upper part of the epitaxial layer 112. An N+-type emitter layer 134 is formed in an upper part of the P-type base layer 132. An N+-type collector leading layer 135 connecting with the first embedded diffusion layer 131 is formed in the epitaxial layer 112 in the first bipolar transistor formation region 191 in a position away from the graft base layer 133.

An N-type second embedded diffusion layer 151 is formed in an upper part of the silicon substrate 111 in the second bipolar transistor formation region 192 at a depth deeper than that of the first embedded diffusion layer 131. The impurity concentration of this second embedded diffusion layer 151 is lower than the impurity concentration of the first embedded diffusion layer 131 even if it is approximately equal to or higher than the impurity concentration of the epitaxial layer 112.

The second embedded diffusion layer 151 is also slightly diffused into a lower part of the epitaxial layer 112.

A P-type base layer 152 and a P+-type graft base layer 153 connecting with this base layer 152 are formed in an upper part of the epitaxial layer 112 in the second bipolar transistor formation region 192. An N+-type emitter layer 154 is formed in an upper part of the base layer 152. Also, an N+-type collector leading layer 155 connecting with the second embedded diffusion layer 151 is formed in the epitaxial layer 112 in the second bipolar transistor formation region 192 in a position away from the graft base layer 153.

A first oxide film 115 is formed on the epitaxial layer 112, and first openings 136, 156 are formed in the first oxide film 115 above the base layers 132, 152 and the graft base layers 133, 153. Base leading electrodes 137, 157 connecting with the graft base layers 133, 153 through the first openings 136, 156 are formed on the first oxide film 115. Also, a second oxide film 116 is formed on the first oxide film 115 in such a state that it covers the base leading electrodes 137, 157.

Second openings 138, 158 are formed in the second oxide film 116 above the base layers 132, 152, and on the side walls thereof are formed side wall insulating films 139, 159. The inner sides of these side wall insulating films 139, 159 form emitter openings 140, 160, and the emitter layers 134, 154 are at the bottoms of the emitter openings 140, 160.

Emitter leading electrodes 141, 161 connecting with the emitter layers 134, 154 through the emitter openings 140, 160 are formed in the second oxide film 116.

Base contact holes 142, 162 are formed in the second oxide film 116 above the base leading electrodes 137, 157, and collector contact holes 143, 163 are formed in the first and second oxide films 115, 116 above the collector leading layers 135, 155. Also formed are base electrodes 144, 164 connecting with the base leading electrodes 137, 157 through the base contact holes 142, 162, emitter electrodes 145, 165 connecting with the emitter leading electrodes 141, 161, and collector electrodes 146, 166 connecting with the collector leading layers 135, 155 through the collector contact holes 143, 163.

Thus are constructed a first bipolar transistor 101 and a second bipolar transistor 102, and the first and second bipolar transistors 101 and 102 constitute a semiconductor device 105.

Figure 6:
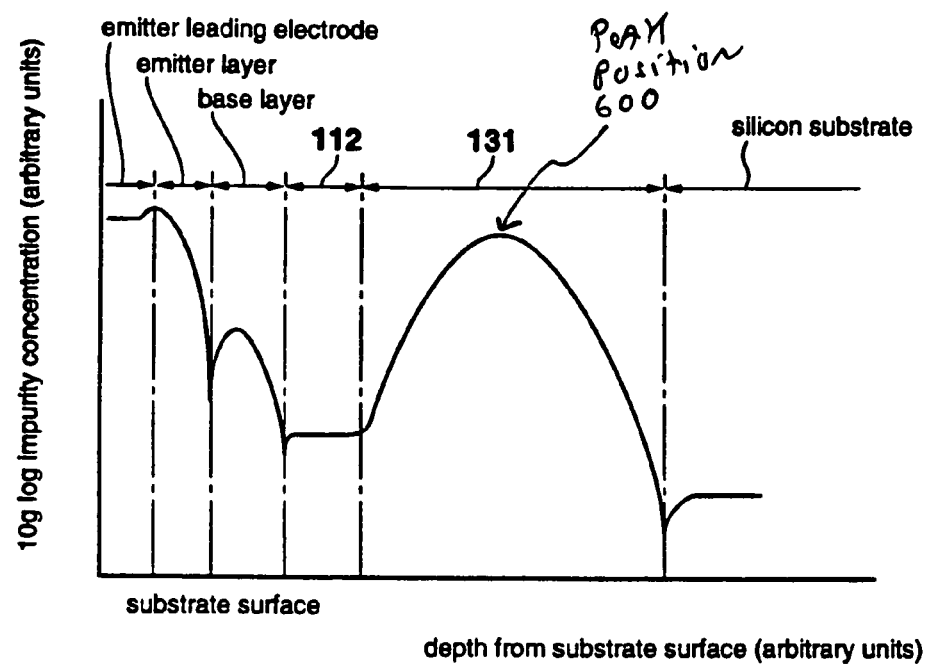
FIG. 6 is a graph showing an impurity distribution of a first bipolar transistor of the invention.
Figure 7:
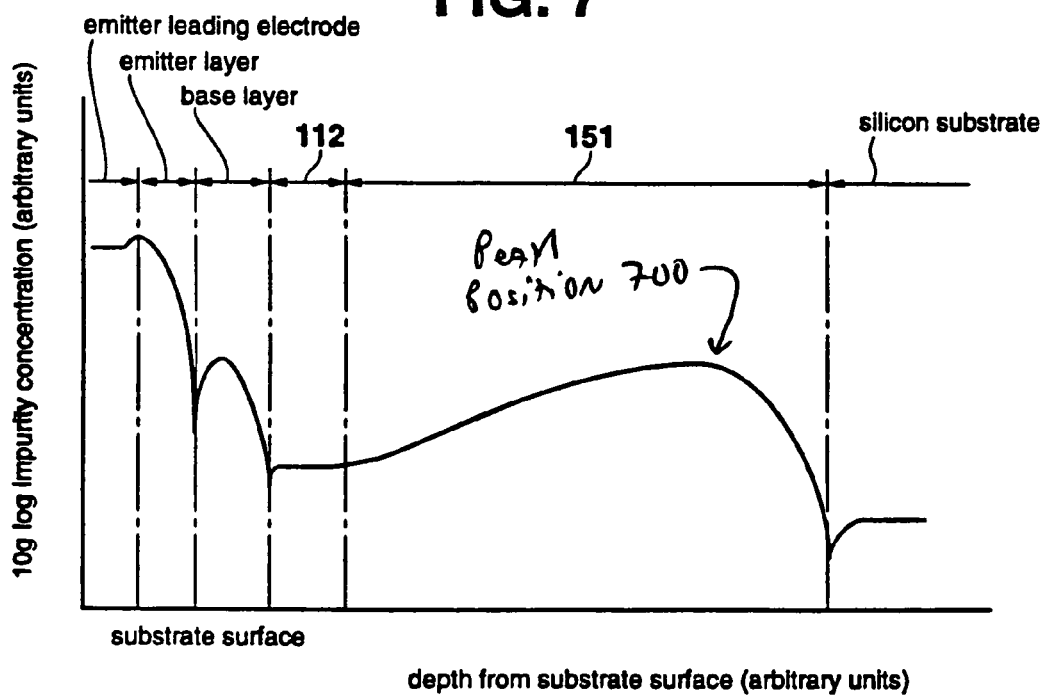
FIG. 7 is a graph showing an impurity distribution of a second bipolar transistor of the invention.

The impurity distribution of the first bipolar transistor 101 will be described with reference to FIG. 6 and the impurity distribution of the second bipolar transistor 102 will be described with reference to FIG. 7. In FIG. 6 and FIG. 7, the vertical axis shows impurity concentration on a log scale (in arbitrary units), and the horizontal axis shows depth from the surface of the substrate (in arbitrary units).

In the first bipolar transistor 101, as shown in FIG. 6, the N-type epitaxial layer 112 functions as an effective collector. The first embedded diffusion layer 131 may include a peak position 600 of an impurity concentration that may reside at a first distance from a datum surface of the substrate 111 (for example an arbitrary surface used as a reference, such as a bottom surface of the substrate 111). The first embedded diffusion layer 131 has the function of causing collector current heading through the low-concentration epitaxial layer 112 in the layer direction to flow into the first embedded diffusion layer 131 and thereby reducing the collector resistance. Therefore, the epitaxial layer 112 effectively becomes a collector layer, and a thin collector layer is realized.

In the second bipolar transistor 102, on the other hand, as shown in FIG. 7, because the second embedded diffusion layer 151 is formed, the state is as if the epitaxial layer 112 had been made thick. That is, the N-type epitaxial layer 112 and the N-type second embedded diffusion layer 151 function as an effective collector layer. Consequently, because the thickness of the collector layer effectively becomes thick, the voltage of the second bipolar transistor 102 is high. Additionally, the second embedded diffusion layer 151 may include a peak position 700 of an impurity concentration that may reside at a second distance from the datum surface of the substrate 111 such that the first distance (peak position 600 of FIG. 6 to the datum surface of the substrate 111) may be greater than the second distance (peak position 700 of FIG. 7 to the datum surface of the substrate 111).

Therefore, because the thickness of the collector layer of the first bipolar transistor 101 is thinner than the thickness of the collector layer of the second bipolar transistor 102 and the second embedded diffusion layer 151 has a lower impurity concentration than the first embedded diffusion layer 131, the first bipolar transistor 101 operates at a higher speed than the second bipolar transistor 102 and the second bipolar transistor 102 has a higher voltage than the first bipolar transistor 101.

Furthermore, because the operating speeds and the voltages are changed by changing the impurity concentrations and depths of the first and second embedded diffusion layers 131, 151, the first and second bipolar transistors 101 and 102 can be formed on the same semiconductor substrate 110.

A second preferred embodiment of the invention will now be described.

A method for manufacturing the semiconductor device 105 described above with reference to FIG. 5 according to a second preferred embodiment of the invention is described below with reference to FIG. 8A through FIG. 8V.

As shown in FIG. 8A, by thermal oxidation, an oxide film 211 is formed on a P-type silicon substrate 111 to a thickness of about 10 nm to 30 nm. Then, by lithography (for example formation of a resist film by resist coating followed by exposure, developing and baking; similarly hereinafter), a resist mask 212 is formed. This resist mask 212 covers a first bipolar transistor formation region 191 where a high speed vertical type NPN bipolar transistor is to be formed, and an opening 213 is formed therein above a region where a second embedded diffusion layer (151) is to be formed in a second bipolar transistor formation region 192 where a high voltage vertical type NPN bipolar transistor is to be formed.

Then, by ion injection using the resist mask 212, for example N-type impurity ions are doped into the silicon substrate 111 to form a second embedded diffusion layer (151).

As the ion injection conditions, for example phosphorus ions (Phos$^+$) are used as the N-type impurity ions, the ion injection energy is set for example in the range 300 keV to 1 MeV, and the dose amount is set in the range $1\times10^{13}$ ions/cm$^2$ to $1\times10^{15}$ ions/cm$^2$.

After that, the resist mask 212 is removed by an existing resist removal method (for example ashing and washing).

As shown in FIG. 8B, by for example CVD (Chemical Vapor Deposition), an oxide film 214 is formed on the silicon substrate 111 to a thickness of 300 nm. In the drawings, the oxide film 214 is shown including the oxide film (211). Then, by lithography and etching (for example reactive ion etching, or RIE), an opening 215 is formed in the oxide film 214 above a region where a first embedded diffusion layer is to be formed in the first bipolar transistor formation region 191.

After that, the resist film formed by lithography is removed by an existing resist removal method (for example ashing and washing). In the following description, all resist films used in etching are removed after etching is completed.

Then, using the oxide film 214 as a mask, by gas diffusion (for example at a diffusion temperature of 1200° C.) of antimony (Sb) using antimony oxide (Sb$_2$O$_3$), an N$^+$-type first embedded diffusion layer 131 is formed in the silicon substrate 111. The sheet resistance (ρs) at this time is for example set in the range 20 Ω/□ to 50 Ω/□, and the diffusion depth (xj) is set in the range 1 μm to 2 μm.

In this diffusion, the above-mentioned doped N-type impurity (phosphorus ions) are also diffused and form an N-type second embedded diffusion layer 151. Also, an oxide film (not shown) is formed on the exposed surface of the silicon substrate 111.

After that, by etching and washing, the oxide film 211 and the oxide film 214 formed on the silicon substrate 111 are removed.

Then, as shown in FIG. 8C, by an existing epitaxial growth method, an N-type epitaxial layer 112 whose resistivity is in the range 0.3 Ωcm to 5 Ωcm and whose thickness is in the range 0.7 μm to 2 μm is formed on the silicon substrate 111, and a semiconductor substrate 110 consisting of the silicon substrate 111 and the epitaxial layer 112 is thereby obtained.

In this epitaxial growth, the first embedded diffusion layer 131 diffuses into the lower side of the epitaxial layer 112, and the second embedded diffusion layer 151 is diffused as far as the interface between the epitaxial layer 112 and the silicon substrate 111.

Next, as shown in FIG. 8D, by thermal oxidation, an oxide film 216 is formed on the surface of the epitaxial layer 112 to a film thickness in the range 20 nm to 50 nm. Also, by reduced pressure CVD, a silicon nitride film 217 is formed to a film thickness in the range 50 nm to 100 nm. The film thicknesses of the oxide film 216 and the silicon nitride film 217 are determined to control the length of so-called bird's beaks, stresses and defect occurrence at the time of a local oxidation [for example LOCOS (Local Oxidation of Silicon)] in a later step.

Next, as shown in FIG. 8E, by lithography and etching (for example reactive ion etching), openings 218 are formed in the oxide film 216 and the silicon nitride film 217 above regions where an oxide film is to be formed by LOCOS, and an upper part of the epitaxial layer 112 is also etched. That is, the oxide film 216 and the silicon nitride film 217 are left above the first embedded diffusion layer 131 and the second embedded diffusion layer 151.

So that after oxidation by LOCOS the surface of a device separating oxide film (113) thereby formed is substantially flat, the epitaxial layer 112 is etched to a depth equivalent to ½ the thickness of the device separating oxide film (113).

Figure 8F:
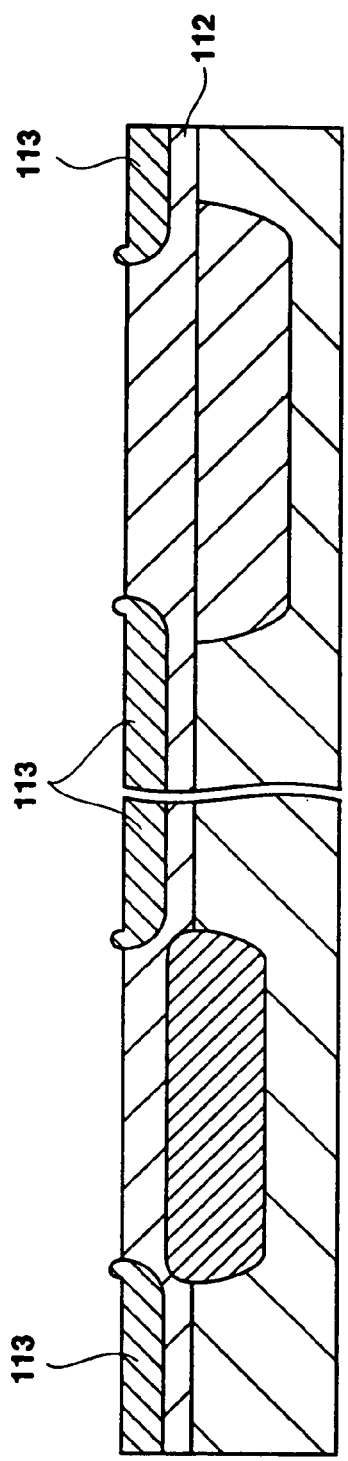
FIG. 8A through FIG. 8V are views illustrating a manufacturing process of a second preferred embodiment of the invention.

After that, as shown in FIG. 8F, by a known local oxidation method (for example LOCOS), a device separating oxide film 113 of thickness 0.6 μm to 1.5 μm is formed on the exposed areas of the epitaxial layer 112. As the conditions of this LOCOS, for example the oxidizing atmosphere is made a steam atmosphere in a temperature range of 1000° C. to 1050° C. and the oxidation time is set in the range 2 to 6 hours.

After that, by wet etching using hot phosphoric acid, the silicon nitride film (217) is removed. FIG. 8F shows the substrate after the silicon nitride film (217) is removed.

Figure 8G:
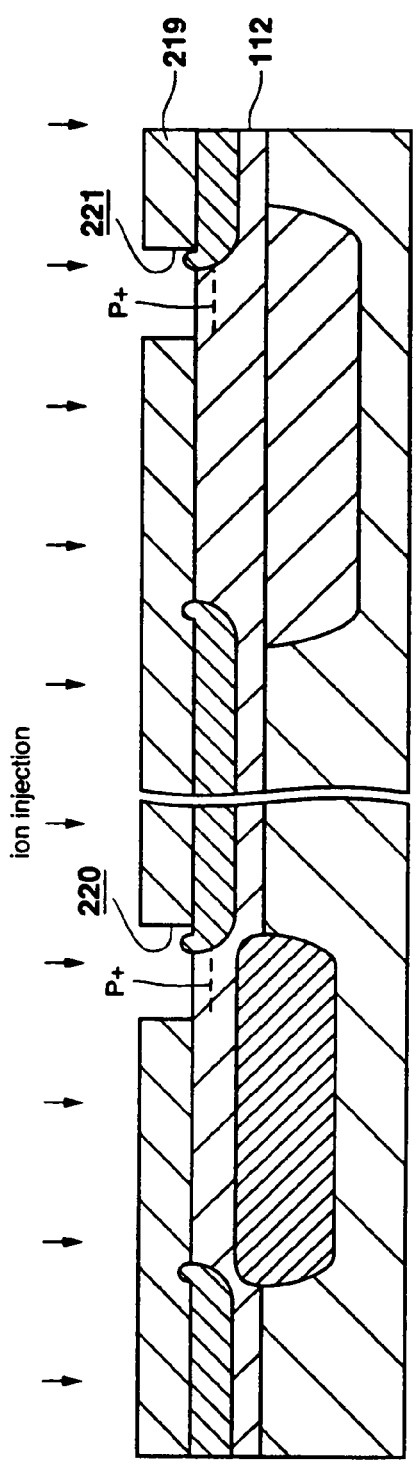

Then, as shown in FIG. 8G, by lithography, a resist mask 219 is formed. Openings 220, 221 are formed in this resist mask 219 above areas where N$^+$-type collector leading diffusion layers (135, 155) are to be formed.

Then, by ion injection using the resist mask 219, phosphorus ions (Phos$^+$) for forming the collector leading diffusion layers (135, 155) are doped into the epitaxial layer 112 through the openings 220, 221.

As the ion injection conditions, the ion injection energy is set for example in the range 40 keV to 100 keV and the dose amount is set in the range $1\times10^{15}$ ions/cm$^2$ to $1\times10^{16}$ ions/cm$^2$.

After that, the resist mask 219 is removed by an existing resist removal method (for example ashing and washing).

Then, as shown in FIG. 8H, by for example CVD, an oxide film 222 is formed over the entire surface of the semiconductor substrate 110 to a thickness in the range 100 nm to 600 nm. After that, by diffusing the above-mentioned phosphorus ions (Phos$^+$) by carrying out annealing in a temperature range of 900° C. to 1000° C. for example for 30 minutes, the above-mentioned N$^+$-type collector leading diffusion layers 135, 155 are formed.

Then, to flatten bird's heads 113b of the device separating oxide film 113 formed by the above-mentioned LOCOS, a resist film 223 is formed by a resist coating method.

After that, as shown in FIG. 8I, by etching, the resist film (223) is removed and upper parts of the bird's heads 113b are also removed, and flattening of the surfaces of the epitaxial layer 112 and the device separating oxide film 113 is thereby carried out.

This flattening can also be carried out by fine polishing (for example chemical-mechanical polishing) using as a polishing stopper the silicon nitride film (217) used in the above-mentioned LOCOS. In this case, the silicon nitride film (217) is removed after the polishing.

Next, as shown in FIG. 8J, for example by thermal oxidation, an oxide film (not shown) is formed on the exposed surface of the semiconductor substrate 110 (the epitaxial layer 112) to a thickness in the range 10 nm to 30 nm. This thermal oxidation is carried out at a temperature of for example 900° C.

After that, by lithography, a resist mask 224 is formed. Openings 225 are formed in this resist mask 224 above areas where a P$^+$-type device separating diffusion layer (114) is to be formed.

Then, by ion injection using the resist mask 224, boron ions (B+) for forming a P$^+$-type device separating diffusion layer (114) are doped into the semiconductor substrate 110 (the epitaxial layer 112).

As the ion injection conditions, the ion injection energy is set for example in the range 200 keV to 900 keV and the dose amount is set in the range $1\times10^{13}$ ions/cm$^2$ to $1\times10^{14}$ ions/cm$^2$.

After that, the resist mask 224 is removed by an existing resist removal method (for example ashing and washing).

Then, as shown in FIG. 8K, by for example CVD, a first oxide film 115 is formed over the entire surface of the semiconductor substrate 110 to a thickness in the range 50 nm to 200 nm.

A resist mask 226 is then formed by lithography. Openings 227, 228 are formed in this resist mask 226 above areas where base electrode parts of the NPN transistors are to be formed.

Then, by etching using the resist mask 226 as a mask, the first oxide film 115 and the oxide film (not shown) mentioned above with reference to FIG. 8J are etched to form first openings 136, 156. This etching is carried out using for example oxygen (O$_2$) and trifluoromethane (CHF$_3$) for the etching gas.

Then, as shown in FIG. 8L, for example by CVD, a polysilicon film 229 is formed over the entire surface of the semiconductor substrate 110 to a thickness in a range of for example 100 nm to 300 nm and in such a state that it covers the first oxide film 115.

Then, by ion injection, boron difluoride ions (BF$_2{}^+$) are doped into the entire surface of the polysilicon film 229.

As the ion injection conditions at this time, the ion injection energy is set for example in the range 30 keV to 70 keV and the dose amount is set in the range $1\times10^{14}$ ions/cm$^2$ to $1\times10^{16}$ ions/cm$^2$.

After that, as shown in FIG. 8M, by lithography, resist masks 230, 231 are formed. These resist masks 230, 231 are formed in such a state that they cover areas where emitters and bases are to be formed.

Then, using the resist masks 230, 231, the polysilicon film 229 is etched to form base leading electrodes 137, 157. This etching is carried out using for example trichlorotrifluoroethane (C$_2$Cl$_3$F$_3$) and sulfur-hexafluoride (SF$_6$) for the etching gas.

FIG. 8M shows the substrate after etching of the polysilicon film 229 is carried out.

Then, as shown in FIG. 8N, by for example CVD, a second oxide film 116 is formed over the entire surface of the semiconductor substrate 110 in such a state that it covers the base leading electrodes 137, 157.

Then, by lithography, a resist mask 232 is formed. This resist mask 232 has openings 233, 234 formed therein above the areas where the emitters and bases are to be formed.

By etching, for example reactive ion etching, using the resist mask 232, the second oxide film 116 and the base leading electrode 137, 157 at the bottoms of the openings 233, 234 are removed to form second openings 138, 158. In this etching, for example oxygen (O$_2$) and trifluoromethane (CHF$_3$) are used for the etching gas for etching the second oxide film 116 and trichlorotrifluoroethane (C$_2$Cl$_3$F$_3$) and sulfur-hexafluoride (SF$_6$) are used for the etching gas for etching the base leading electrodes 137, 157.

After that, as shown in FIG. 8O, for example by thermal oxidation, a thin oxide film (not shown) is formed over the entire surface of the semiconductor substrate 110. This oxide film serves as a buffer film during ion injection and is formed to a film thickness of for example about 10 nm.

Then, by ion injection using the second oxide film 116 as an ion injection mask, boron difluoride ions (BF$_2{}^+$) are doped into the epitaxial layer 112 at the bottoms of the second openings 138, 158 to form base layers (132, 152) in the epitaxial layer 112.

As the ion injection conditions at this time, the ion injection energy is set for example in the range 20 keV to 100 keV and the dose amount is set in the range $1\times10^{13}$ ions/cm$^2$ to $1\times10^{14}$ ions/cm$^2$.

Figure 8P:
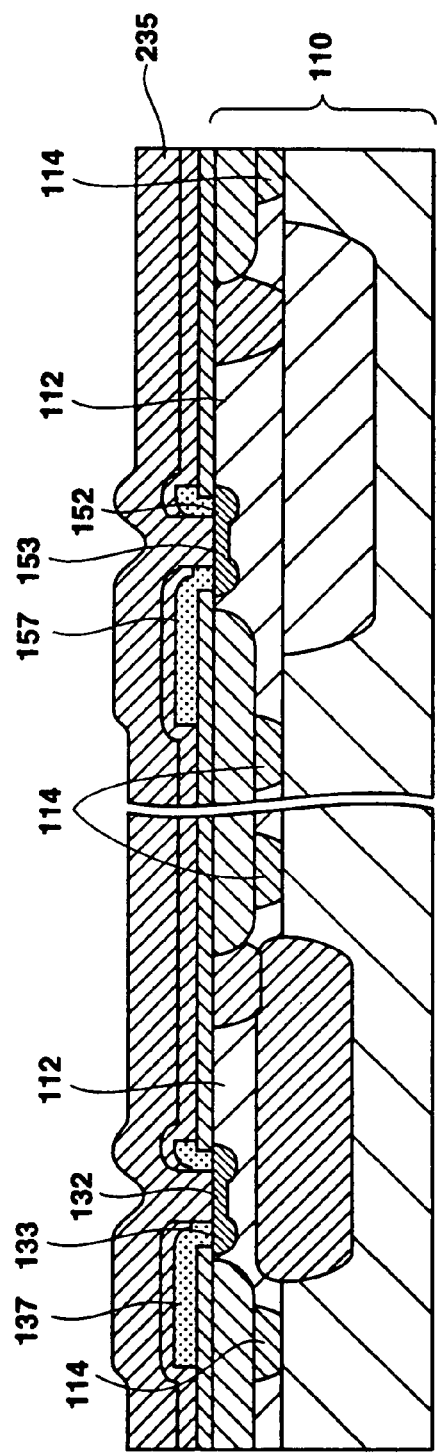

Then, as shown in FIG. 8P, for example by CVD, an oxide film 235 is formed to a film thickness in the range 300 nm to 600 nm in such a state that it covers the entire surface of the semiconductor substrate 110. After that, the base layers 132, 152 and the device separating diffusion layer 114 are activated by carrying out annealing in an 800° C. to 950° C. atmosphere for 10 to 60 minutes. At this time, high concentration boron diffuses from the base leading electrodes 137, 157 into the epitaxial layer 112, and graft base layers 133, 153 are thereby formed. Diffusion into this region also occurs during later annealing.

Figure 8Q:
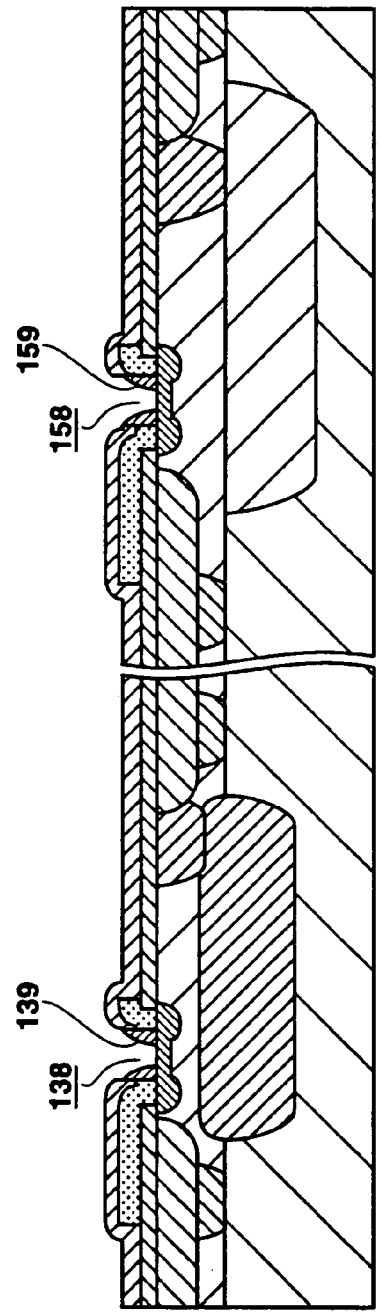

After that, as shown in FIG. 8Q, by reactive ion etching, the oxide film 235 is anisotropically etched to form side wall insulating films 139, 159 on the side walls of the second openings 138, 158. This etching is carried out using for example oxygen (O$_2$) and trifluoromethane (CHF$_3$) for the etching gas.

Then, as shown in FIG. 8R, for example by CVD, a polysilicon film 236 is formed to a film thickness of 50 nm to 200 nm in such a state that it covers the entire surface of the semiconductor substrate 110. After that, by ion injection, arsenic ions (As+) are doped over the entire surface of the polysilicon film 236.

As the ion injection conditions at this time, the ion injection energy is set for example in the range 30 keV to 100 keV and the dose amount is set in the range $1 \times 10^{15}$ ions/cm² to $1 \times 10^{16}$ ions/cm².

After that, as shown in FIG. 8S, for example by CVD, an oxide film 237 is formed over the entire surface of the polysilicon film 236 to a film thickness of for example 300 nm. Then, either by carrying out furnace annealing in an 800° C. to 950° C. atmosphere for 10 to 60 minutes or carrying out rapid thermal annealing (RTA) at a temperature of 900° C. to 1100° C. for several seconds to several tens of seconds, impurity from the polysilicon film 236 is diffused into upper parts of the base layers 132, 152 to form and activate emitter layers 134, 154.

Next, as shown in FIG. 8T, by wet etching, the oxide film (237) is removed. After that, by lithography, resist masks 238, 239 are formed. These resist masks 238, 239 are formed in such a state that they cover the areas where the emitter parts are formed.

Then, by etching using the resist masks 238, 239, the polysilicon film (236) is etched to form emitter leading electrodes 141, 161. This etching is carried out using for example trichlorotrifluoroethane ($C_2Cl_3F_3$) and sulfurhexafluoride ($SF_6$) for the etching gas.

After that, as shown in FIG. 8U, by lithography, a resist mask 240 is formed. This resist mask 240 has openings 241 to 244 formed above areas where contact holes for electrodes connecting with the base leading electrodes 137, 157 and the collector leading diffusion layers 135, 155 are to be formed.

Then, by etching, for example reactive ion etching, using the resist mask 240 as a mask, the second oxide film 116 and the first oxide film 115 at the bottoms of the openings 241 to 244 are removed and the base leading electrodes 137, 157 and the collector leading diffusion layers 135, 155 are thereby exposed.

Figure 8V:
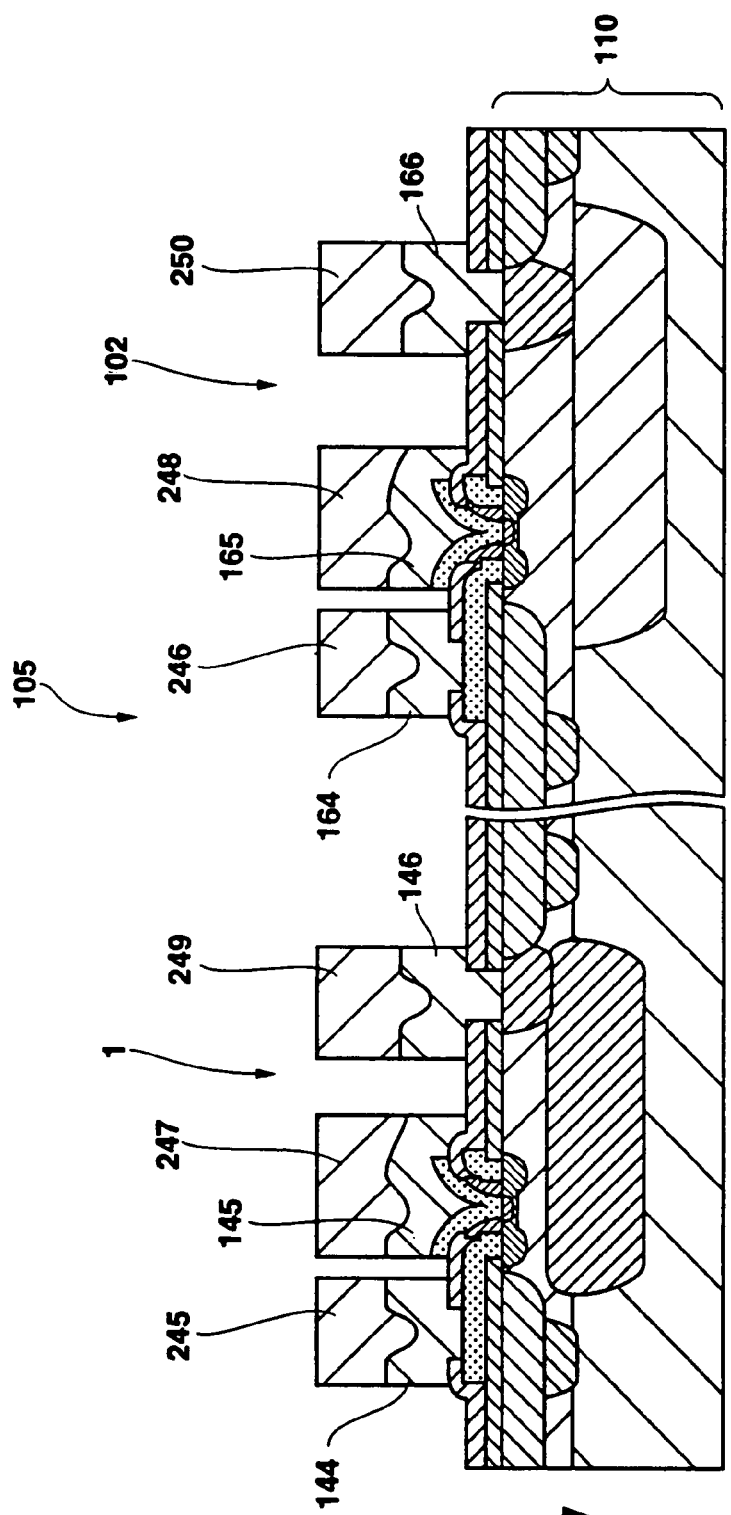

After that, as shown in FIG. 8V, a barrier metal layer and an aluminum metal interconnection layer are formed for example by sputtering, resist masks 245 to 250 are then formed by the lithography and the barrier metal layer and the aluminum metal interconnection layer are then patterned by etching using these resist masks 245 to 250 to form base electrodes 144, 164, emitter electrodes 145, 165 and collector electrodes 146, 166.

After that, the resist masks 245 to 250 are removed by for example ashing.

In this way, a semiconductor device 105 made up of the first bipolar transistor 101 which is a high speed vertical type NPN bipolar transistor and the second bipolar transistor 102 which is a high voltage vertical type NPN bipolar transistor is formed on the single semiconductor substrate 110.

Thereafter, although not shown in the drawings, multiple layer interconnections are formed using conventional methods.

In the manufacturing method of the semiconductor device 105 described above with reference to FIG. 8A through FIG. 8V, because a first embedded diffusion layer 131 of the same conductive type as the epitaxial layer 112 is formed in an upper part of the silicon substrate 111 in the region 191 where the first vertical type bipolar transistor 101 is formed, in the first vertical type bipolar transistor 101, although the epitaxial layer 112 and the first embedded diffusion layer 131 constitute collector layers, effectively the epitaxial layer 112 becomes the collector layer.

On the other hand, because a second embedded diffusion layer 151 of the same conductive type as the epitaxial layer 112 is formed in an upper part of the silicon substrate 111 in the region 192 where the second vertical type bipolar transistor 102 is formed, in the second vertical type bipolar transistor 102, both the epitaxial layer 112 and the second embedded diffusion layer 151 become an effective collector layer.

Furthermore, since the impurity concentration of the second embedded diffusion layer 151 is lower than the impurity concentration of the first embedded diffusion layer 131 and the depth of the second embedded diffusion layer 151 is deeper than the depth of the first embedded diffusion layer 131, the effective collector layer of the second vertical type bipolar transistor 102 is thicker than the effective collector layer of the first vertical type bipolar transistor 101 and also has a lower impurity concentration. As a result, the first vertical type bipolar transistor 101 can operate at a higher speed than the second vertical type bipolar transistor 102 and the second vertical type bipolar transistor 102 has a higher voltage than the first vertical type bipolar transistor 101.

In the second vertical type bipolar transistor 102 described above, because the second embedded diffusion layer 151 is formed deeper and with a lower concentration than the first embedded diffusion layer 131, the problems arise that the current amplification factor hFE of a parasitic PNP transistor (the P+-type graft base layer 153 is equivalent to an emitter, the N-type epitaxial layer 112 is equivalent to a base and the P-type silicon substrate 111 is equivalent to a collector) becomes large and also the collector resistance becomes large. In this connection, a third preferred embodiment of the invention which is means for solving these problems will now be described with reference to the schematic sectional construction view of FIG. 9.

Figure 9:
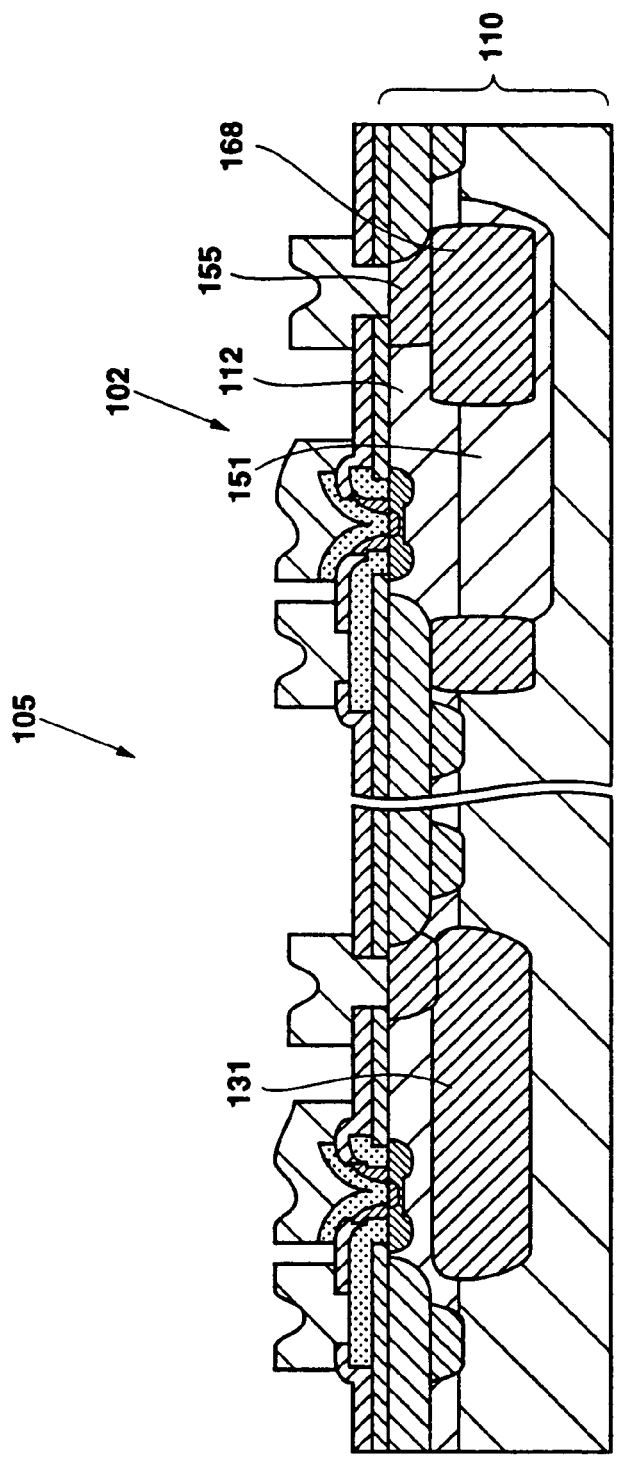
FIG. 9 is a schematic sectional construction view of a semiconductor device of a third preferred embodiment of the invention.

As shown in FIG. 9, the semiconductor device 105 of this third preferred embodiment is one similar to the semiconductor device 105 described above with reference to FIG. 5 wherein in the second bipolar transistor 102 an embedded diffusion layer 168 connecting to the N+-type collector leading diffusion layer 155 formed in the epitaxial layer 112 and with an N+-type second embedded diffusion layer 151 and having an impurity concentration higher than the impurity concentration of the second embedded diffusion layer 151 is formed in an upper part of the semiconductor substrate 110.

This embedded diffusion layer 168 is formed simultaneously with the first embedded diffusion layer 131 and has the same conductive type, the same impurity concentration and the same depth as the first embedded diffusion layer 131.

In this way it is possible to suppress parasitic transistor operation of the second vertical type bipolar transistor 102 and also greatly suppress increase in its collector resistance.

A fourth preferred embodiment of the invention will now be described.

A method for manufacturing the semiconductor device 105 described above with reference to FIG. 9 according to a fourth preferred embodiment of the invention is described below with reference to FIG. 10A through FIG. 10C. In FIG. 10A through FIG. 10C, parts described above with reference to FIG. 8A through FIG. 8V have been given the same reference numerals.

As shown in FIG. 10A, by thermal oxidation, an oxide film 211 is formed on a P-type silicon substrate 111 to a thickness of about 10 nm to 30 nm. After that, by lithography, a resist mask 212 is formed. This resist mask 212 covers a first bipolar transistor formation region 191, and an opening 213 is formed therein above a region where an N$^+$-type second embedded diffusion layer (151) is to be formed in a second bipolar transistor formation region 192.

Then, by ion injection using the resist mask 212, for example N-type impurity ions are doped into the silicon substrate 111 to form a second embedded diffusion layer (151).

As the ion injection conditions, for example phosphorus ions (Phos$^+$) are used as the above-mentioned N-type impurity ions, the ion injection energy is set for example in the range 300 keV to 1 MeV and the dose amount is set in the range $1\times10^{13}$ ions/cm$^2$ to $1\times10^{15}$ ions/cm$^2$.

After that, by an existing resist removal method (for example ashing and washing), the resist mask 212 is removed.

As shown in FIG. 10B, by for example CVD, an oxide film 214 is formed on the silicon substrate 111 to a thickness of 300 nm. Then, by lithography and etching (for example reactive ion etching), an opening 215 and an opening 261 are formed in the oxide film 214 above a region in the first bipolar transistor formation region 191 where a first embedded diffusion layer (131) is to be formed and above a region in the second bipolar transistor formation region 192 where an N$^+$-type embedded diffusion layer (168) is to be formed.

After that, the resist film formed by lithography is removed by an existing resist removal method (for example ashing and washing). In the following description, all resist films used in etching are removed after etching is completed.

Then, using the oxide film 214 as a mask, by gas phase diffusion (for example at a diffusion temperature of 1200° C.) of antimony (Sb) using antimony oxide (Sb$_2$O$_3$), an N$^+$-type first embedded diffusion layer 131 and an N$^+$-type embedded diffusion layer 168 are formed in the silicon substrate 111. The sheet resistance (ρs) at this time is for example set in the range 20 Ω/□ to 50 Ω/□, and the diffusion depth (xj) is set in the range 1 μm to 2 μm.

In this gas phase diffusion, an oxide film (not shown) is formed on the exposed surface of the silicon substrate 111.

Next, as shown in FIG. 10C, by an existing epitaxial growth method, an N-type epitaxial layer 112 whose resistivity is in the range 0.3 Ωcm to 5 Ωcm and whose thickness is in the range 0.7 μm to 2 μm is formed on the silicon substrate 111, and a semiconductor substrate 110 consisting of the silicon substrate 111 and the epitaxial layer 112 is thereby obtained.

In this epitaxial growth, the first embedded diffusion layer 131 diffuses into the lower side of the epitaxial layer 112, and the second embedded diffusion layer 151 is diffused as far as the interface between the epitaxial layer 112 and the silicon substrate 111. The embedded diffusion layer 168 is also diffused like the first embedded diffusion layer 131.

Thereafter, the same steps as those illustrated in FIG. 8D through FIG. 8V are carried out.

As a result, a semiconductor device 105 of the kind of construction described above with reference to FIG. 9 is obtained.

In the method for manufacturing the semiconductor device 105 described above with reference to FIG. 10A through FIG. 10C, the embedded diffusion layer 168 can be formed simultaneously with the step of forming the first embedded diffusion layer 131, which is a conventional step. Therefore, there is no increase in the number of steps.

Next, a semiconductor device of a fifth preferred embodiment of the invention will be described with reference to the schematic sectional construction view of FIG. 11. Here, the case of a semiconductor device made up of a high voltage vertical type NPN bipolar transistor (hereinafter referred to as the second bipolar transistor) and a vertical type PNP bipolar transistor (hereinafter referred to as the third bipolar transistor) will be described.

The second bipolar transistor has the same construction as the second bipolar transistor described above with reference to FIG. 5.

Parts the same as parts described above with reference to FIG. 5 have been given the same reference numerals.

As shown in FIG. 11, an N-type epitaxial layer 112 is formed on a P-type silicon substrate 111.

A device separating oxide film 113 for separating a second bipolar transistor formation region 192 from a third bipolar transistor formation region 193 is formed in the epitaxial layer 112. A P$^+$-type device separating diffusion layer 114 reaching the silicon substrate 111 is formed below this device separating oxide film 113.

As in the case described above with reference to FIG. 5, an N-type second embedded diffusion layer 151 is formed in an upper part of the silicon substrate 111 in the second bipolar transistor formation region 192 at a depth deeper than an embedded diffusion layer of an N$^+$-type embedded diffusion layer of a high speed vertical type NPN bipolar transistor (not shown). The impurity concentration of this second embedded diffusion layer 151 is lower than the impurity concentration of the above-mentioned N$^+$-type embedded diffusion layer even if it is approximately equal to or higher than the impurity concentration of the epitaxial layer 112.

The second embedded diffusion layer 151 is also slightly diffused into a lower part of the epitaxial layer 112.

A P-type base layer 152 and a P$^+$-type graft base layer 153 connecting with this base layer 152 are formed in an upper part of the epitaxial layer 112 in the second bipolar transistor formation region 192. An N$^+$-type emitter layer 154 is formed in an upper part of the base layer 152. Also, an N$^+$-type collector leading diffusion layer 155 connecting with the second embedded diffusion layer 151 is formed in the epitaxial layer 112 in the second bipolar transistor formation region 192 in a position away from the graft base layer 153.

An N-type separating diffusion layer 194 and a P$^+$-type embedded diffusion layer 171 separated from the silicon substrate 111 by this N-type separating diffusion layer 194 are formed in an upper part of the silicon substrate 111 in the third bipolar transistor formation region 193. The separating diffusion layer 194 is formed at a depth substantially equal to that of the second embedded diffusion layer 151. The P$^+$-type embedded diffusion layer 171 is also diffused slightly into a lower part of the epitaxial layer 112.

An N-type base layer 172 is formed in an upper part of the epitaxial layer 112, and an N$^+$-type base leading diffusion layer 173 is formed in an upper part of this N-type base layer 172. A P$^+$-type emitter layer 174 is formed in an upper part of the base layer 172 away from this N$^+$-type base leading diffusion layer 173. Also, a P$^+$-type collector leading diffusion layer 175 connecting with the above-mentioned P-type embedded diffusion layer 171 is formed in the epitaxial layer 112 in the third bipolar transistor formation region 193.

A first oxide film 115 is formed on the device separating oxide film 113 and the epitaxial layer 112. Also, a first opening 156 is formed in the first oxide film 115 on the base layer 152 and the graft base layer 153. A base leading electrode 157 connecting with the graft base layer 153 through the first opening 156 is formed on the first oxide film 115.

An opening 176 is formed in the first oxide film 115 on the P⁺-type emitter layer 174, and an emitter leading electrode 177 is formed passing through this opening 176. An opening 178 is formed in the first oxide film 115 on the P⁺-type collector leading diffusion layer 175, and a collector leading electrode 179 is formed passing through this opening 178.

Also, a second oxide film 116 is formed over the entire surface of the first oxide film 115.

A second opening 158 is formed in the second oxide film 116 above the base layer 152, and on the side wall thereof is formed a side wall insulating film 159. The inner side of this side wall insulating film 159 forms an emitter opening 160, and the emitter layer 154 is at the bottom of this emitter opening 160.

A base contact hole 162 is formed in the second oxide film 116 above the base leading electrode 157, and a collector contact hole 163 is formed in the first and second oxide films 115, 116 above the collector leading diffusion layer 155. Also formed are a base electrode 164 connecting with the base leading electrode 157 through the base contact hole 162, an emitter electrode 165 connecting with an emitter leading electrode 161, and a collector electrode 166 connecting with the collector leading diffusion layer 155 through the collector contact hole 163.

A base contact hole 180 is formed in the first and second oxide films 115, 116 above the N⁺-type base leading diffusion layer 173, and an emitter contact hole 181 and a collector contact hole 182 are formed in the second oxide film 116 above the emitter leading electrode 177 and the collector leading electrode 179. Also formed are a base electrode 183 connecting with the N⁺-type base leading diffusion layer 173 through the base contact hole 180, an emitter electrode 184 connecting with the N⁺-type emitter leading electrode 177 through the emitter contact hole 181, and a collector electrode 185 connecting with the collector leading electrode 179 through the collector contact hole 182.

Thus are formed a second bipolar transistor 102 and a third bipolar transistor 103 constituting a semiconductor device 106.

Of course, it is possible to form a high speed vertical type NPN bipolar transistor having an N⁺-type embedded diffusion layer on the P-type silicon substrate 111 and the N-type epitaxial layer 112 on which the semiconductor device 106 described above is formed. In that case, the N⁺-type embedded diffusion layer is formed in a position shallower than that of the separating diffusion layer 194.

In the semiconductor device 106 described above with reference to FIG. 11, because the separating diffusion layer 194 is a diffusion layer for separating the P-type embedded diffusion layer 171 from the silicon substrate 111, it has the same conductive type as the epitaxial layer 112. Also, because the second embedded diffusion layer 151 has an impurity concentration lower than the impurity concentration of a first embedded diffusion layer formed in the first bipolar transistor (not shown) and is formed at a depth deeper than that of the first embedded diffusion layer and also is of the same conductive type as the epitaxial layer 112, the separating diffusion layer 194 and the second embedded diffusion layer 151 can consist of diffusion layers formed in the same step.

Also, in the semiconductor device 106, since the epitaxial layer 112 and the second embedded diffusion layer 151 both function as a collector, the second vertical type bipolar transistor 102 has a high voltage.

As a result, it is possible to form the high voltage second bipolar transistor 102 and the third bipolar transistor 103, which is a PNP transistor having superior speed performance, on the same semiconductor substrate 110.

In the second vertical type bipolar transistor 102 described above with reference to FIG. 11, like the second vertical type bipolar transistor 102 described with reference to FIG. 9, it is possible to form in the silicon substrate 111 an embedded diffusion layer (168) connecting with the second embedded diffusion layer 151 and with the collector leading diffusion layer 155 and having an impurity concentration higher than the impurity concentration of the second embedded diffusion layer 151. This embedded diffusion layer (168) can be made of the same conductive type and formed with the same impurity concentration and at the same depth as the first embedded diffusion layer 131 in the first bipolar transistor 101.

Next, a sixth preferred embodiment of the invention, which is an example of a method for manufacturing the semiconductor device 106, will be described with reference to FIG. 12A through FIG. 12J.

In the figures, parts the same as parts described above with reference to FIG. 8A through FIG. 8V and FIG. 11 have been given the same reference numerals.

As shown in FIG. 12A, by thermal oxidation, an oxide film 211 is formed on a P-type silicon substrate 111 to a thickness of about 10 nm to 30 nm. After that, by lithography, a resist mask 212 is formed. This resist mask 212 covers a region (not shown) where a first bipolar transistor is to be formed, and has an opening 213a above a region where a second embedded diffusion layer 151 in a second bipolar transistor formation region 192 is to be formed and has an opening 213b above a region where an N-type separating diffusion layer 194 in a third bipolar transistor formation region 193 is to be formed.

Then, by ion injection using the resist mask 212 as an ion injection mask, for example N-type impurity ions are doped into the silicon substrate 111 to later form the second embedded diffusion layer (151) and the N-type separating diffusion layer (194).

As the ion injection conditions, for example phosphorus ions (Phos⁺) are used as the above-mentioned N-type impurity ions, the ion injection energy is set for example in the range 300 keV to 1 MeV and the dose amount is set in the range $1 \times 10^{13}$ ions/cm² to $1 \times 10^{15}$ ions/cm².

After that, by an existing resist removal method (for example ashing and washing), the resist mask 212 is removed.

When a high speed vertical type NPN bipolar transistor is to be formed on the same substrate, as shown in FIG. 12B, by for example CVD, an oxide film 214 is formed on the silicon substrate 111 to a thickness of 300 nm. Here, the above-mentioned oxide film (211) is shown included in this oxide film 214. Then, by lithography and etching (for example reactive ion etching), an opening (not shown) is formed in the oxide film 214 above a region in the first bipolar transistor formation region (not shown) where a first embedded diffusion layer is to be formed.

After that, the resist film formed by lithography is removed by an existing resist removal method (for example ashing and washing). In the following description, all resist films used in etching are removed after etching is completed.

Then, using the oxide film 214 as a mask, by gas phase diffusion (for example at a diffusion temperature of 1200° C.) of antimony (Sb) using antimony oxide (Sb₂O₃), the first embedded diffusion layer (not shown) of the high speed vertical type NPN bipolar transistor is formed in the silicon substrate 111. The sheet resistance (ρs) at this time is for example set in the range 20 Ω/□ to 50 Ω/□, and the diffusion depth (xj) is set in the range 1 μm to 2 μm.

In this diffusion, the above-mentioned doped N-type impurity (phosphorus ions) are also diffused and the second embedded diffusion layer 151 and the separating diffusion layer 194 are formed. Also, an oxide film (not shown) is formed on the exposed surface of the silicon substrate 111.

After that, by hydrofluoric acid wet etching and washing, the oxide film 214 (including the oxide film 211) on the silicon substrate 111 is removed.

Next, as shown in FIG. 12C, by an existing epitaxial growth method, an N-type epitaxial layer 112 whose resistivity is in the range 0.3 Ωcm to 5 Ωcm and whose thickness is in the range 0.7 μm to 2 μm is formed on the silicon substrate 111, and a semiconductor substrate 110 consisting of the silicon substrate 111 and the epitaxial layer 112 is thereby obtained.

In this epitaxial growth, the first embedded diffusion layer (not shown) is diffused into the lower side of the epitaxial layer 112, and the second embedded diffusion layer 151 and the separating diffusion layer 194 slightly diffuse into a lower part of the epitaxial layer 112.

Then, as shown in FIG. 12D, by thermal oxidation, an oxide film 216 is formed at the surface of the epitaxial layer 112 to a film thickness in the range 20 nm to 50 nm. Also, by reduced pressure CVD, a silicon nitride film 217 is formed to a film thickness in the range 50 nm to 100 nm.

Then, by lithography and etching (for example reactive ion etching), openings 218 are formed in the oxide film 216 and the silicon nitride film 217 above regions where a device separating oxide film is to be formed by LOCOS, and an upper part (the part shown with broken lines in FIG. 12D) of the epitaxial layer 112 is also removed. So that the surface of a device separating oxide film (113) formed by LOCOS and the surface of the epitaxial layer 112 become substantially level, the epitaxial layer 112 is etched to a depth equivalent to ½ the film thickness of the device separating oxide film (113).

After that, as shown in FIG. 12D and FIG. 12E, by a local oxidation method (for example LOCOS), a device separating oxide film 113 of thickness 0.6 μm to 1.5 μm is formed on the exposed areas of the epitaxial layer 112. As the conditions of this LOCOS, for example the oxidizing atmosphere is made a steam atmosphere in a temperature range of 1000° C. to 1050° C. and the oxidation time is set in the range 2 to 6 hours.

After that, by wet etching using hot phosphoric acid, the silicon nitride film (217) is removed.

Then, by lithography, a resist mask (not shown) in which is formed an opening above a region where an N$^+$-type collector leading diffusion layer (155) is to be formed, and by ion injection using this, phosphorus ions (Phos$^+$) for forming the collector leading diffusion layer (155) in the epitaxial layer 112 are doped through the above-mentioned opening.

As the ion injection conditions, the ion injection energy is set for example in the range 40 keV to 100 keV and the dose amount is set in the range $1 \times 10^{15}$ ions/cm$^2$ to $1 \times 10^{16}$ ions/cm$^2$.

After that, the resist mask is removed by an existing resist removal method (for example ashing and washing).

Next, for example by CVD, an oxide film (not shown) is formed over the entire surface of the semiconductor substrate 110 to a thickness in the range 100 nm to 600 nm. After that, by carrying out annealing in the temperature range 900° C. to 1000° C. for example for 30 minutes, the above-mentioned phosphorus ions (Phos$^+$) are diffused and the N$^+$-type collector leading diffusion layer 155 is formed.

Also, to flatten bird's heads of the device separating oxide film 113 formed by the above-mentioned LOCOS, a resist film (not shown) is formed by resist coating. After that, by etching back, this resist film and the oxide film are removed and upper parts of bird's heads formed in the device separating oxide film 113 are removed and flattening of the surfaces of the epitaxial layer 112 and the device separating oxide film 113 is thereby carried out.

This flattening can also be carried out by fine polishing (for example chemical-mechanical polishing) using as a polishing stopper the silicon nitride film (217) used in the above-mentioned LOCOS. In this case, the silicon nitride film (217) is removed after the polishing.

Figures 12F, 12G:
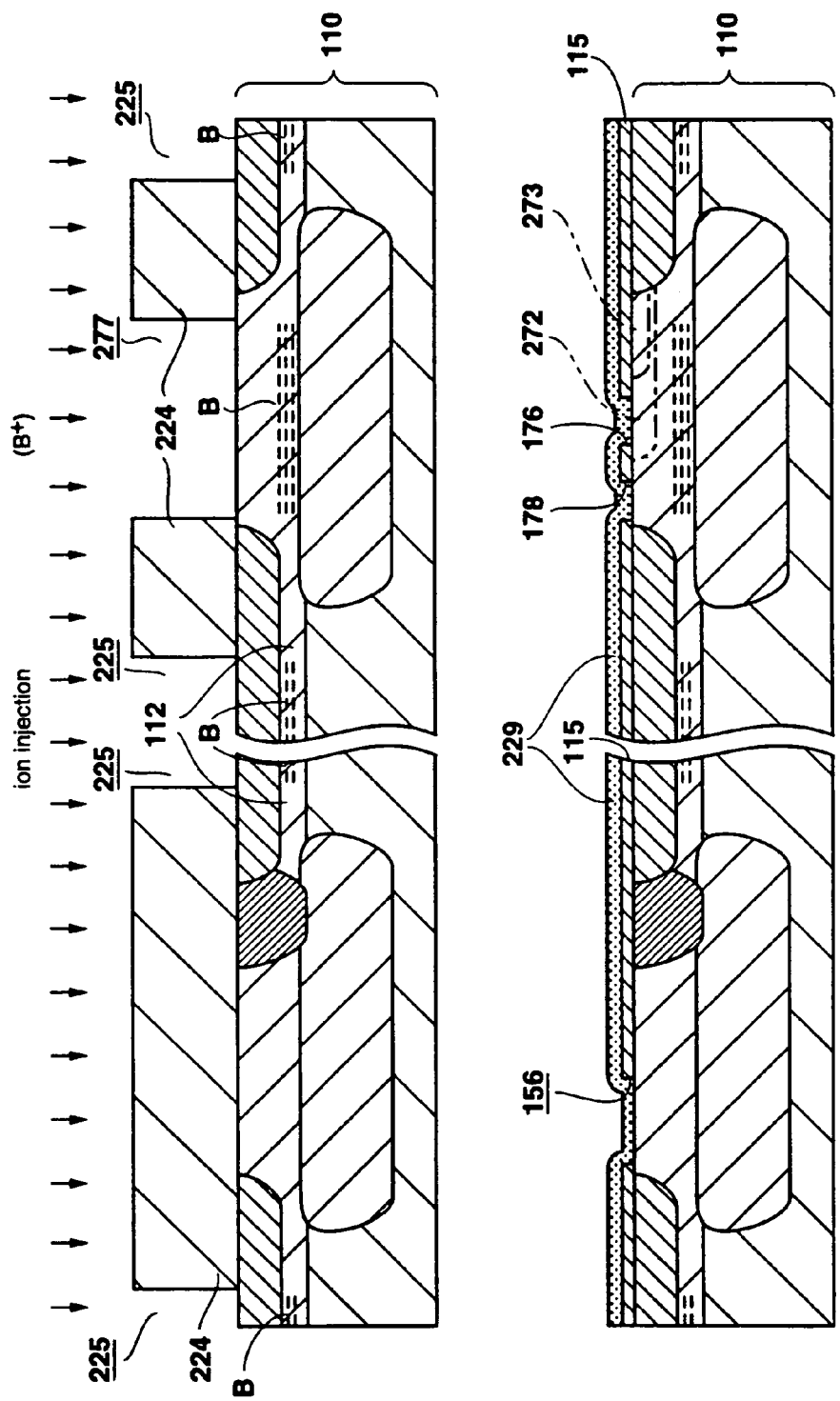

Referring now to FIG. 12F, first, for example by thermal oxidation, an oxide film (not shown) is formed on the exposed surface of the semiconductor substrate 110 (the epitaxial layer 112) to a thickness in the range 10 nm to 30 nm. This thermal oxidation is carried out at a temperature of for example 900° C.

After that, by lithography, a resist mask 224 is formed having openings 225 above areas where a P$^+$-type device separating diffusion layer is to be formed and having an opening 277 above an area where a P$^+$-type embedded diffusion layer is to be formed.

Then, by ion injection using the resist mask 224, boron ions (B$^+$) for forming the P$^+$-type device separating diffusion layer and the P$^+$-type embedded diffusion layer are doped into the semiconductor substrate 110 (the epitaxial layer 112).

As the ion injection conditions, the ion injection energy is set for example in the range 200 keV to 900 keV and the dose amount is set in the range $1 \times 10^{13}$ ions/cm$^2$ to $1 \times 10^{15}$ ions/cm$^2$. In FIG. 12F, the doped boron is denoted by the letter B.

After that, the resist mask 224 is removed by an existing resist removal method (for example ashing and washing).

As shown in FIG. 12G, by lithography, a resist mask (not shown) having an opening (not shown) above a PNP vertical type bipolar transistor base layer formation region 272 is formed, and by ion injection using this resist mask phosphorus ions (Phos$^+$) are doped into the base layer formation region 272.

As the ion injection conditions at this time, for example the ion injection energy is set in the range 150 keV to 300 keV and the dose amount is set in the range $1 \times 10^{13}$ ions/cm$^2$ to $1 \times 10^{14}$ ions/cm$^2$.

The resist mask used in this ion injection is then removed by an existing removal method (for example ashing and washing). After that, by lithography, a resist mask (not shown) having an opening (not shown) above a PNP vertical type bipolar transistor base leading diffusion layer formation region 273 is formed, and by ion injection using this resist mask arsenic ions (As$^+$) are doped into the base leading diffusion layer formation region 273.

As the ion injection conditions at this time, for example the ion injection energy is set in the range 30 keV to 70 keV and the dose amount is set in the range $1 \times 10^{15}$ ions/cm$^2$ to $1 \times 10^{16}$ ions/cm$^2$.

The resist mask used in this ion injection is then removed by an existing removal method (for example ashing and washing).

Then, for example by CVD, a first oxide film 115 is formed over the entire surface of the semiconductor substrate 110 to a thickness in the range 50 nm to 200 nm.

Next, by lithography, a resist mask (not shown) having openings (not shown) above a base layer formation region of an NPN vertical type bipolar transistor and an emitter layer formation region and a collector leading diffusion layer formation region of a PNP vertical type bipolar transistor, and by etching using this resist mask the first oxide film 115 and the oxide film (not shown) mentioned above with reference to FIG. 12F are etched to form a first opening 156, an opening 176 and an opening 178.

This etching is carried out using for example oxygen ($O_2$) and trifluoromethane ($CHF_3$) for the etching gas.

Next, for example by CVD, a polysilicon film 229 is formed over the entire surface of the semiconductor substrate 110 to a thickness in the range 100 nm to 300 nm in such a state that it covers the first oxide film 115.

Then, by ion injection, boron difluoride ions ($BF_2^+$) are doped into the entire surface of the polysilicon film 229.

As the ion injection conditions at this time, for example the ion injection energy is set in the range 30 keV to 70 keV and the dose amount is set in the range $1 \times 10^{14}$ ions/cm$^2$ to $1 \times 10^{16}$ ions/cm$^2$.

After that, as shown in FIG. 12H, by lithography, and etching, a base leading electrode 157 of the NPN vertical type bipolar transistor and an emitter leading electrode 177 and a collector leading electrode 179 of the PNP vertical type bipolar transistor are formed with the polysilicon film 229.

This etching is carried out using for example trichlorotrifluoroethane ($C_2Cl_3F_3$) and sulfur-hexafluoride ($SF_6$) for the etching gas.

Next, by for example CVD, a second oxide film 116 is formed over the entire surface of the semiconductor substrate 110.

Then, by lithography and etching, the second oxide film 116 and the base leading electrode 157 over an emitter/base formation region are etched to form a second opening 158.

In this etching, for example oxygen ($O_2$) and trifluoromethane ($CHF_3$) are used for the etching gas for etching the second oxide film 116 and trichlorotrifluoroethane ($C_2Cl_3F_3$) and sulfur-hexafluoride ($SF_6$) are used for the etching gas for etching the base leading electrode 157, which is made of polysilicon.

After that, as shown in FIG. 12I, by thermal oxidation, a thin oxide film (not shown) is formed over the entire surface of the semiconductor substrate 110. This thin oxide film serves as a buffer film during ion injection and is formed to a film thickness of for example about 10 nm.

Then, by ion injection using the second oxide film 116 as an ion injection mask, boron difluoride ions ($BF_2^+$) are doped into the epitaxial layer 112 at the bottom of the second opening 158 to form a base layer 152 in the epitaxial layer 112.

As the ion injection conditions at this time, the ion injection energy is set for example in the range 20 keV to 100 keV and the dose amount is set in the range $1 \times 10^{13}$ ions/cm$^2$ to $1 \times 10^{14}$ ions/cm$^2$.

Then, for example by CVD, an oxide film is formed to a film thickness in the range 300 nm to 600 nm in such a state that it covers the entire surface of the semiconductor substrate 110. After that, the base layer 152, the device separating diffusion layer 114 and the P$^+$-type embedded diffusion layer 171 are activated by carrying out annealing in an 800° C. to 950° C. atmosphere for 10 to 60 minutes. At this time, boron diffuses from the base leading electrode 157 into the epitaxial layer 112 and a high concentration graft base layer 153 is thereby formed connecting with the base layer 152. Diffusion into this region also occurs during later annealing. At the same time, boron diffuses from the emitter leading electrode 177 into the epitaxial layer 112 and forms a high concentration emitter layer 174, and boron also diffuses from the collector leading electrode 179 into the epitaxial layer 112 and forms a high concentration collector leading diffusion layer 175 connecting with the P$^+$-type embedded diffusion layer 171.

After that, by reactive ion etching, the above-mentioned oxide film is anisotropically etched and a side wall insulating film 159 is thereby formed on the side wall of the second opening 158.

This etching is carried out using for example oxygen ($O_2$) and trifluoromethane ($CHF_3$) for the etching gas.

Figure 12J:
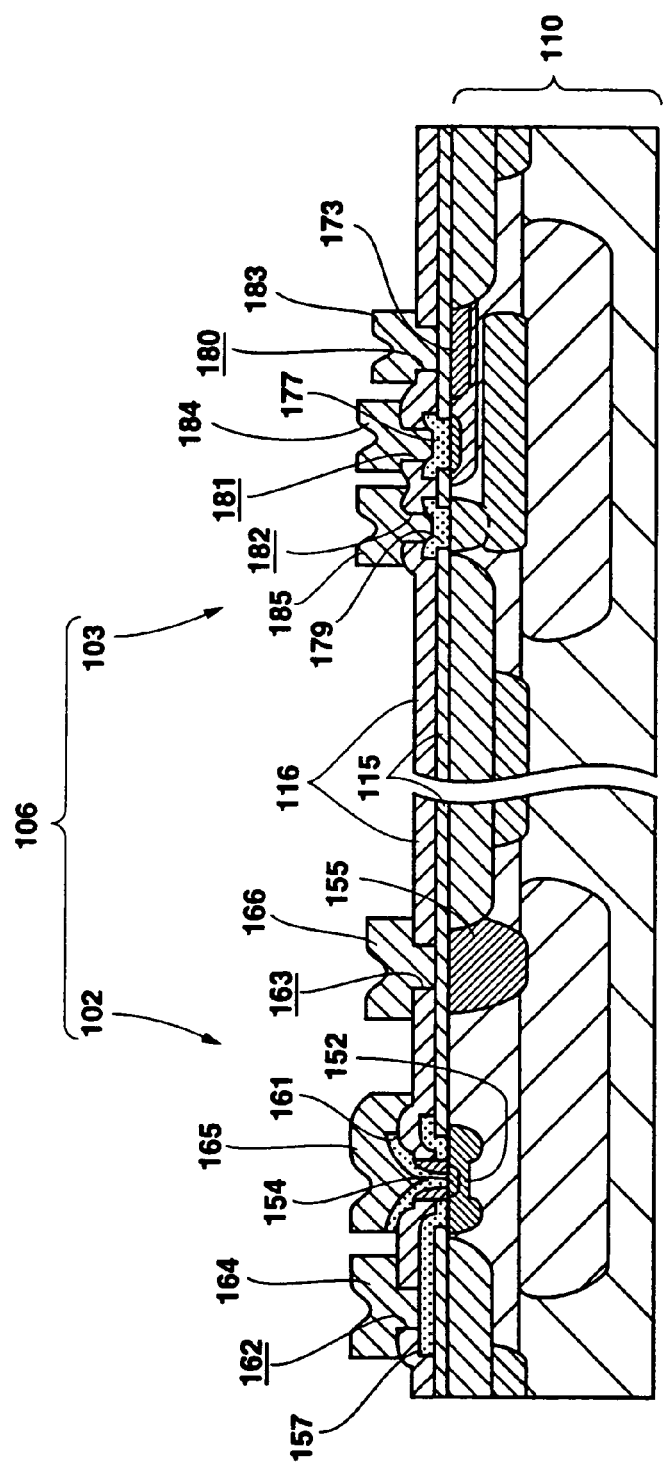

Next, as shown in FIG. 12J, for example by CVD, a polysilicon film for forming an emitter leading electrode is formed to a film thickness in the range 50 nm to 200 nm in such a state that it covers the entire surface of the semiconductor substrate 110. After that, by ion injection, arsenic ions ($As^+$) are doped into the entire surface of the above-mentioned polysilicon film.

As the ion injection conditions, for example the ion injection energy is set in the range 30 keV to 100 keV and the dose amount is set in the range $1 \times 10^{15}$ ions/cm$^2$ to $1 \times 10^{16}$ ions/cm$^2$.

After that, for example by CVD, an oxide film (not shown) is formed over the entire surface of the polysilicon film to a film thickness of for example 300 nm. Then, either by carrying out furnace annealing in an 800° C. to 950° C. atmosphere for 10 to 60 minutes or carrying out rapid thermal annealing (RTA) at a temperature of 900° C. to 1100° C. for several seconds to several tens of seconds, impurity from the polysilicon film is diffused into an upper part of the base layer 152 to form and activate an emitter layer 154.

Next, by wet etching, the oxide film exposed at the surface is removed. Then, by lithography and etching, the polysilicon film is processed to form an emitter leading electrode 161. This etching is carried out using for example trichlorotrifluoroethane ($C_2Cl_3F_3$) and sulfur-hexafluoride ($SF_6$) for the etching gas.

After that, by lithography, a base contact hole 162 passing through to the base leading electrode 157, an emitter contact hole 181 passing through to the emitter leading electrode 177 and a collector contact hole 182 passing through to the collector leading electrode 179 are formed in the second oxide film 116. Also, a collector contact hole 163 passing through to the collector leading diffusion layer 155 and a base contact hole 180 passing through to the N$^+$-type base leading diffusion layer 173 are formed in the second oxide film 116 and the first oxide film 115.

After that, a barrier metal layer and an aluminum metal interconnection layer are formed for example by sputtering and then the barrier layer and the aluminum metal interconnection layer are patterned by lithography and etching to form a base electrode 164 connecting with the base leading electrode 157 through the base contact hole 162, an emitter electrode 165 connecting with the emitter leading electrode 161, and a collector electrode 166 connecting with the collector leading diffusion layer 155 through the collector contact hole 163. Also formed are a base electrode 183 connecting with the N$^+$-type base leading diffusion layer 173 through the base contact hole 180, an emitter electrode 184 connecting with the N$^+$-type emitter leading electrode 177 through the emitter contact hole 181 and a collector electrode 185 connecting with the collector leading electrode 179 through the collector contact hole 182.

Thus is formed a semiconductor device 106 made up of the second bipolar transistor 102, which is a high voltage vertical type NPN bipolar transistor, and the third bipolar transistor 103, which is a high speed vertical type PNP bipolar transistor, formed on the same semiconductor substrate 110.

Thereafter, although not shown in the drawings, multiple layer interconnections are formed using conventional methods.

In the semiconductor device 106 manufacturing method described above, the step of forming the second embedded diffusion layer 151 in the second bipolar transistor formation region 192 and the step of forming the N-type separating diffusion layer 194 in the third bipolar transistor formation region 193 can be carried out simultaneously. As a result, increase in the number of steps is minimized.

Figure 13A:
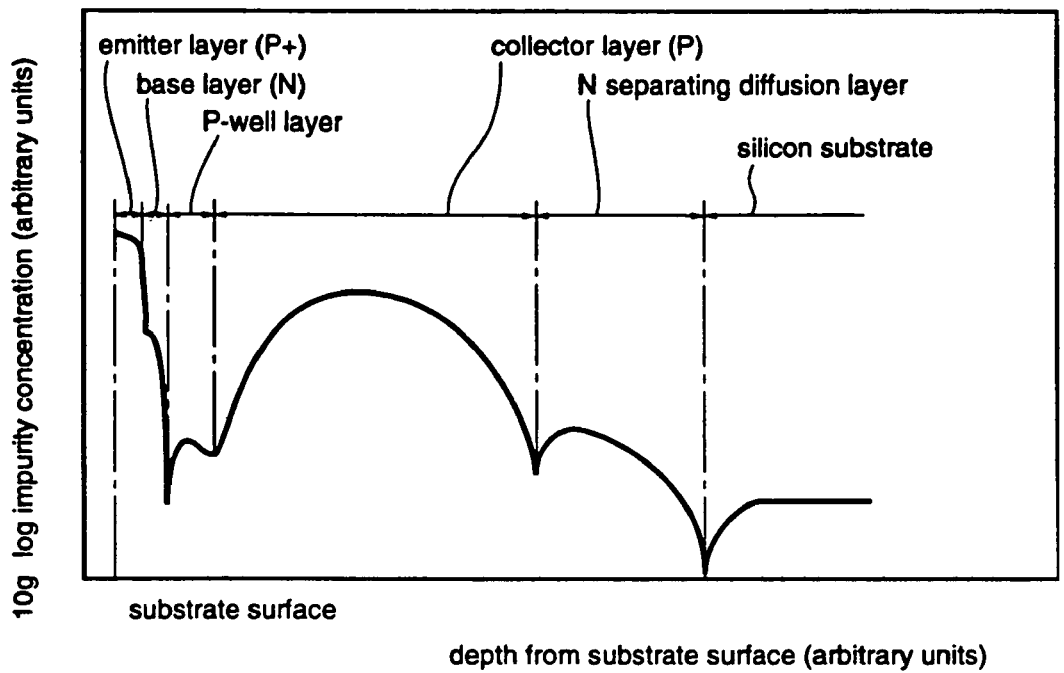
FIG. 13A and FIG. 13B are graphs showing impurity distributions of vertical type PNP and NPN bipolar transistors shown in FIG. 12J.
Figure 13B:
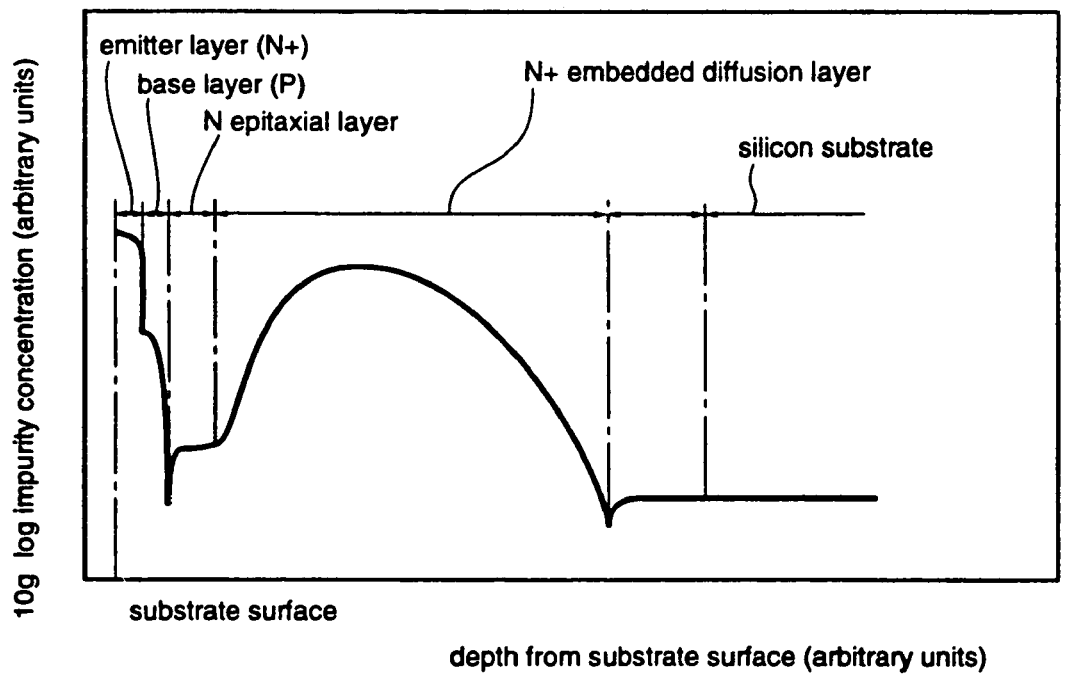

Normally, when a vertical type PNP bipolar transistor and a high speed vertical type NPN bipolar transistor are formed on the same substrate, their depth direction impurity distributions are as shown in FIG. 13A and FIG. 13B. FIG. 13A shows the impurity distribution in the depth direction of the vertical type PNP bipolar transistor and FIG. 13B shows the impurity distribution in the depth direction of the high speed vertical type NPN bipolar transistor. In both of the figures, the vertical axis shows impurity distribution on a log scale (in arbitrary units) and the horizontal axis shows depth from the substrate surface.

The N-type separating diffusion layer of the vertical type PNP bipolar transistor shown in FIG. 13A is deeper and has a lower concentration than the embedded diffusion layer of the high speed vertical type NPN bipolar transistor shown in FIG. 13B.

Thus it can be seen that by making a diffusion layer formed simultaneously with this N-type separating diffusion layer of the vertical type PNP bipolar transistor a second embedded diffusion layer of the vertical type NPN bipolar transistor whose voltage is to be made high, it is possible to eliminate upward diffusion of the second embedded diffusion layer and obtain a high voltage vertical type NPN bipolar transistor without making the thickness of the N-type epitaxial layer thick.

Therefore, by employing the kind of process described above with reference to FIG. 12A through FIG. 12J, a high voltage vertical type NPN bipolar transistor can be realized without the N-type epitaxial layer being made thick.

Also, by the same manufacturing method as that described above with reference to FIG. 10, it is possible to form an embedded diffusion layer (168) in the second bipolar transistor 102. That is, the first embedded diffusion layer 131 in the first bipolar transistor 101 and an N$^+$-type embedded diffusion layer (168) can be formed in the same step. As a result, it is not, necessary to increase the number of steps in order to form the embedded diffusion layer (168).

As described above, in a semiconductor device of the invention, because the second embedded diffusion layer in the second vertical type bipolar transistor has a lower impurity concentration and is at a deeper depth than the first embedded diffusion layer in the first vertical type bipolar transistor, in the second vertical type bipolar transistor the epitaxial layer and the second embedded diffusion layer both effectively function as a collector layer.

Because consequently the collector layer of the second vertical type bipolar transistor is thicker than the collector layer of the first vertical type bipolar transistor, the first vertical type bipolar transistor can operate at a higher speed than the second vertical type bipolar transistor and the second vertical type bipolar transistor has a higher voltage than the first vertical type bipolar transistor.

Furthermore, by adopting the construction described above, it is possible to provide the first and second vertical type bipolar transistors on the same substrate.

In another semiconductor device of the invention, the separating diffusion layer of the third vertical type bipolar transistor is of the same conductive type as the epitaxial layer and is formed in a position deeper than the first embedded diffusion layer in the first vertical type bipolar transistor. Also, the second embedded diffusion layer of the second vertical type bipolar transistor is of the same conductive type as the epitaxial layer and has a lower impurity concentration and is formed at a deeper depth than the first embedded diffusion layer in the first vertical type bipolar transistor. As a result, it is possible to constitute the separating diffusion layer and the second embedded diffusion layer with diffusion layers formed in the same step.

Moreover, this semiconductor device also provides the same benefits as the semiconductor device mentioned above.

According to a semiconductor device manufacturing method of the invention, because the second embedded diffusion layer in the second vertical type bipolar transistor is formed in such a state that it has a lower impurity concentration and is at a deeper depth than the first embedded diffusion layer of the first vertical type bipolar transistor, it is possible to make the effective collector layer of the second bipolar transistor thicker and also of a lower impurity concentration than the effective collector layer of the first bipolar transistor. As a result, the first vertical type bipolar transistor can be made a transistor capable of operating at a higher speed than the second vertical type bipolar transistor and it is possible to make the second vertical type bipolar transistor a transistor having a higher voltage than the first vertical type bipolar transistor.

According to another semiconductor device manufacturing method of the invention, because the second embedded diffusion layer in the second vertical type bipolar transistor and the separating diffusion layer of the third vertical type bipolar transistor can be formed in the same step, it is not necessary to perform a new step for forming the second embedded diffusion layer.

That is, without increasing the number of manufacturing steps it is possible to form the first vertical type bipolar transistor, the second vertical type bipolar transistor whose voltage is different from that of the first bipolar transistor and the third vertical type bipolar transistor having the opposite polarity to the polarity of the second bipolar transistor all on the same substrate.

What is claimed is:

1. A semiconductor device having a first vertical type bipolar transistor and a second vertical type bipolar transistor each transistor having an emitter, a base, and a collector, the semiconductor device comprising:

a P-type substrate;

an N-type epitaxial layer formed on the substrate;

a first embedded diffusion layer formed as a part of the collector of the first vertical type bipolar transistor in a first upper part of the substrate and in the epitaxial layer; and a second embedded diffusion layer formed as a part of the collector of the second vertical type bipolar transistor directly on the substrate, in a second upper part of the substrate, wherein a top of the second embedded diffusion layer is formed at a distance from a surface of the emitter of the second vertical type bipolar transistor greater than a distance between a top of the first embedded diffusion layer and a surface of the emitter of the first vertical type bipolar transistor, and a bottom of the second embedded diffusion layer is formed at a distance from the surface of the emitter of the second vertical type bipolar transistor greater than a distance between a bottom of the first embedded diffusion layer and the surface of the emitter of the first vertical type bipolar transistor;

wherein the collector of the first vertical type bipolar transistor has a thickness that is less than a thickness of the collector of the second vertical type bipolar transistor, which results in the second vertical type bipolar transistor having a breakdown voltage that is higher than a breakdown voltage of the first vertical type bipolar transistor.

2. A semiconductor device according to claim 1, wherein an impurity concentration of the second embedded diffusion layer includes a first impurity concentration that is equal to and a second impurity concentration that is greater than an impurity concentration of that portion of the epitaxial layer formed above the second embedded diffusion layer, and wherein a distance between a location of peak impurity concentration within the second embedded diffusion layer and a location where the second embedded diffusion layer meets the substrate is less than one-half of a distance between the location of peak impurity concentration and a location where the second embedded diffusion layer meets the epitaxial layer.

3. A semiconductor device according to claim 1, wherein the substrate is a single substrate, and wherein an impurity concentration of the second embedded diffusion layer is between about $1 \times 10^{13}$ and about $1 \times 10^{15}$.

4. A semiconductor device according to claim 1 further comprising:
a first base layer disposed between two first graft base layers and disposed above the first embedded diffusion layer on the epitaxial layer to define a first epitaxial thickness between the first base layer and the first embedded diffusion layer; and
a second base layer disposed between two second graft base layers and disposed above the second embedded diffusion layer on the epitaxial layer to define a second epitaxial thickness between the second base layer and the second embedded diffusion layer,
wherein the first epitaxial thickness is less than the second epitaxial thickness; and
wherein only the epitaxial layer is disposed between the base layer and the second embedded diffusion layer.

5. A semiconductor device according to claim 1, wherein an impurity concentration of the second embedded diffusion layer is approximately equal to or higher than an impurity concentration of said epitaxial layer at all depths of the second vertical type bipolar transistor between the surface of the emitter of the second vertical type bipolar transistor and a position of peak impurity concentration within the second embedded diffusion layer.

6. A semiconductor device according to claim 1, wherein a peak position of an impurity concentration of the second embedded diffusion layer resides at a distance from the surface of the emitter of the second vertical type bipolar transistor that is approximately equal to a distance from the bottom of the first embedded diffusion layer to the surface of the emitter of the first vertical type bipolar transmitter.

7. A semiconductor device according to claim 1, wherein the first vertical type bipolar transistor defines a voltage that is different than a voltage of the second vertical type bipolar transistor,
wherein the substrate is a silicon substrate,
wherein the first embedded diffusion layer includes an impurity concentration that is higher than the epitaxial impurity concentration, and
wherein the second embedded diffusion layer defines a conductive type that is the same as the epitaxial conductive type.

8. A semiconductor device according to claim 1, wherein the second vertical type bipolar transistor includes a base layer disposed between two graft base layers and wherein only the epitaxial layer Is disposed between the base layer and the second embedded diffusion layer.

9. A semiconductor device according to claim 1, wherein the second embedded diffusion layer is an $N^+$-type second embedded diffusion layer and is slightly diffused into a lower part of the epitaxial layer.

10. A semiconductor device of according to claim 1, wherein the thickness of the collector of the first vertical bipolar transistor being less than the thickness of the collector of the second vertical type bipolar transistor also results in the first vertical type bipolar transistor operating at a higher speed than the second vertical type bipolar transistor.

11. A semiconductor device of according to claim 1, wherein the thickness of the collector of the first vertical type bipolar transistor being less than the thickness of the collector of the second vertical type bipolar transistor also results in the second vertical type bipolar transistor operates operating at a higher voltage than the first vertical type bipolar transistor.

12. A semiconductor device having a first vertical type bipolar transistor and a second vertical type bipolar transistor each transistor having an emitter, a base, and a collector, the semiconductor device comprising:
a P-type substrate;
an N-type epitaxial layer formed on the substrate;
a first embedded diffusion layer formed as a part of the first vertical type bipolar transistor in a first upper part of the substrate and in the epitaxial layer; and
a second embedded diffusion layer formed as a part of the second vertical type bipolar transistor directly on the substrate, in a second upper part of the substrate;
wherein the second embedded diffusion layer includes an impurity concentration that is less than an impurity concentration of the first embedded diffusion layer,
wherein a top of the second embedded diffusion layer is formed at a distance from a surface of the emitter of the second vertical type bipolar transistor greater than a distance between a top of the first embedded diffusion layer and a surface of the emitter of the first vertical type bipolar transistor, and a bottom of the second embedded diffusion layer is formed at a distance from the surface of the emitter of the second vertical type bipolar transistor greater than a distance between a bottom of the first embedded diffusion layer and the surface of the emitter of the first vertical type bipolar transistor; and
wherein the collector of the first vertical type bipolar transistor has a thickness that is less than a thickness of the collector of the second vertical type bipolar transistor, which results in the second vertical type bipolar transistor having breakdown voltage that is higher than a breakdown voltage of the first vertical type bipolar transistor.

13. A semiconductor device according to claim 12, wherein a bottom of the collector of the second vertical type bipolar transistor, a bottom of said N-type epitaxial layer, and a top of said P-type substrate are coplanar.

14. A semiconductor device according to claim 12, wherein said N-type epitaxial layer is formed on a top of the first embedded diffusion layer and on a top of the second embedded diffusion layer.

* * * * *